(12) United States Patent
Tanaka et al.

(10) Patent No.: US 9,893,192 B2
(45) Date of Patent: Feb. 13, 2018

(54) SEMICONDUCTOR DEVICE

(71) Applicant: Semiconductor Energy Laboratory Co., Ltd., Atsugi-shi, Kanagawa-ken (JP)

(72) Inventors: Tetsuhiro Tanaka, Isehara (JP); Kazuya Hanaoka, Fujisawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/258,553

(22) Filed: Apr. 22, 2014

(65) Prior Publication Data

US 2014/0319516 A1 Oct. 30, 2014

(30) Foreign Application Priority Data

Apr. 24, 2013 (JP) ................................. 2013-091211

(51) Int. Cl.
  *H01L 29/45* (2006.01)
  *H01L 29/786* (2006.01)
  *H01L 29/417* (2006.01)

(52) U.S. Cl.
  CPC .. *H01L 29/78618* (2013.01); *H01L 29/41733* (2013.01); *H01L 29/7869* (2013.01)

(58) Field of Classification Search
  CPC ........... H01L 29/78618; H01L 29/7869; H01L 29/41733; H01L 29/45; H01L 27/1225;
  (Continued)

(56) References Cited

U.S. PATENT DOCUMENTS 5,081,510 A * 1/1992 Ohtsuka ................ H01L 29/475
                                                              257/473
5,731,856 A   3/1998 Kim et al.
(Continued)

FOREIGN PATENT DOCUMENTS

EP         1737044 A      12/2006
EP         2226847 A       9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — David Vu
*Assistant Examiner* — Mouloucoulaye Inoussa
(74) *Attorney, Agent, or Firm* — Robinson Intellectual Property Law Office; Eric J. Robinson

(57) ABSTRACT

To provide a semiconductor device suitable for miniaturization. To provide a highly reliable semiconductor device. To provide a semiconductor device formed using an oxide semiconductor and having favorable electrical characteristics. A semiconductor device includes an island-shaped semiconductor layer over an insulating surface; a pair of electrodes in contact with a side surface of the semiconductor layer and overlapping with a part of a top surface of the semiconductor layer; an oxide layer located between the semiconductor layer and the electrode and in contact with a part of the top surface of the semiconductor layer and a part of a bottom surface of the electrode; a gate electrode overlapping with the semiconductor layer; and a gate insulating layer between the semiconductor layer and the gate electrode. In addition, the semiconductor layer includes an
(Continued)

oxide semiconductor, and the pair of electrodes includes Al, Cr, Cu, Ta, Ti, Mo, or W.

23 Claims, 13 Drawing Sheets

(58) Field of Classification Search
CPC ..... H01L 27/3262; H01L 21/36; H01L 29/86; H01L 21/336
USPC .......................................... 257/43; 438/104
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,247,276 | B2 | 8/2012 | Kondo et al. |
| 8,471,252 | B2 | 6/2013 | Yamazaki et al. |
| 8,492,756 | B2 | 7/2013 | Sakata et al. |
| 8,624,237 | B2 | 1/2014 | Yamazaki et al. |
| 8,629,432 | B2 | 1/2014 | Sakata et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0244020 | A1* | 9/2010 | Sakata ............... H01L 27/1288 257/43 |
| 2010/0301329 | A1 | 12/2010 | Asano et al. |
| 2011/0084272 | A1* | 4/2011 | Miyanaga ............ H01L 29/45 257/43 |
| 2011/0115763 | A1 | 5/2011 | Yamazaki et al. |
| 2012/0138932 | A1* | 6/2012 | Lin .................. G02F 1/136213 257/59 |
| 2013/0134415 | A1* | 5/2013 | Godo ............... H01L 29/66969 257/43 |
| 2013/0270552 | A1 | 10/2013 | Yamazaki et al. |
| 2013/0320337 | A1 | 12/2013 | Yamazaki et al. |
| 2013/0334533 | A1 | 12/2013 | Yamazaki |
| 2014/0001465 | A1 | 1/2014 | Yamazaki |
| 2014/0004656 | A1 | 1/2014 | Sasagawa et al. |
| 2014/0027762 | A1 | 1/2014 | Tsurume et al. |
| 2014/0042438 | A1 | 2/2014 | Yamazaki |
| 2014/0077205 | A1 | 3/2014 | Yamazaki et al. |
| 2014/0110703 | A1 | 4/2014 | Yamazaki |
| 2014/0110704 | A1 | 4/2014 | Yamazaki et al. |
| 2014/0110708 | A1 | 4/2014 | Koezuka et al. |
| 2014/0113405 | A1 | 4/2014 | Tsubuku et al. |
| 2014/0154837 | A1 | 6/2014 | Yamazaki |
| 2014/0225104 | A1 | 8/2014 | Yamazaki et al. |
| 2014/0239293 | A1 | 8/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |

(56) References Cited

FOREIGN PATENT DOCUMENTS

| JP | 2000-150900 A | 5/2000 |
|---|---|---|
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A(Physical Review. A), May 1, 1984, vol. 29, No. 5, pp. 2957-2959.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures over 1000° C", Journal of Solid State Chemistry, 1965, vol. 60, pp. 382-384.

Nakamura.M et al., "The phase relations in the In2O3-Ga2ZnO4-ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02: Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 As a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", Journal of The SID, 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Applications", SID Digest '07 : SID International Symposium Digest of Technical Papers, 2007, vol. 38, pp. 1673-1676.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, pp. 625-628.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 280-283.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA,AMOLED Display Using In—Ga—Zn-Oxide TFTs With a Novel Passivation Layer", SID Digest '09 : SID International Symposium Digest of Technical Papers, May 31, 2009, pp. 284-287.

(56) References Cited

OTHER PUBLICATIONS

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 501-515.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85; No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

* cited by examiner

150

107 104 103 102 106 105 111 108 101

160

107 104 103 105a 102 106b 106a 105b 111 108 101

170

107 104 103 171 102 172 106 105 111 108 101

SEMICONDUCTOR DEVICE

BACKGROUND OF THE INVENTION

1. Field of the Invention

One embodiment of the present invention relates to semiconductor devices.

In this specification and the like, the term "semiconductor device" means any kind of device that can function by utilizing semiconductor characteristics, and a transistor, a semiconductor circuit, an arithmetic device, a memory device, an imaging device, an electro-optical device, a power generation device (e.g., a thin film solar cell and an organic thin film solar cell), an electronic appliance, and the like are each one embodiment of semiconductor devices.

2. Description of the Related Art

A technique by which transistors are formed using semiconductor thin films formed over a substrate having an insulating surface has been attracting attention. The transistor is applied to a wide range of electronic appliances such as an integrated circuit (IC) or an image display device (also simply referred to as a display device). As semiconductor thin films applicable to the transistors, silicon-based semiconductor materials have been widely used, but oxide semiconductors have been attracting attention as alternative materials.

For example, a technique by which a transistor is formed using zinc oxide or an In—Ga—Zn-based oxide semiconductor as an oxide semiconductor is disclosed (see Patent Documents 1 and 2).

In recent years, demand for integrated circuits in which semiconductor elements such as miniaturized transistors are integrated with high density has risen with increased performance and reductions in the size and weight of electronic appliances.

REFERENCE

Patent Document

[Patent Document 1] Japanese Published Patent Application No. 2007-123861
[Patent Document 2] Japanese Published Patent Application No. 2007-096055

SUMMARY OF THE INVENTION

The accuracy of processing a thin film included in a semiconductor device into a desired shape influences on electric characteristics of the semiconductor device. For example, in a transistor, the distance between a source and a drain greatly influences on electric characteristics of the transistor; thus highly accurate processing is needed. As the shape of a thin film to be processed is minuter, it is more difficult to process the film with high accuracy.

An object of one embodiment of the present invention is to provide a semiconductor device that is suitable for miniaturization.

Another object of one embodiment of the present invention is to provide a highly reliable semiconductor device. Another object of one embodiment of the present invention is to give favorable electrical characteristics to a semiconductor device including an oxide semiconductor.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including: an island-shaped semiconductor layer over an insulating surface; a pair of electrodes in contact with a side surface of the semiconductor layer and overlapping with a part of a top surface of the semiconductor layer; an oxide layer located between the semiconductor layer and the electrode and in contact with a part of the top surface of the semiconductor layer and a part of a bottom surface of the electrode; a gate electrode overlapping with the semiconductor layer; and a gate insulating layer between the semiconductor layer and the gate electrode. In addition, the semiconductor layer includes an oxide semiconductor, and the pair of electrodes includes Al, Cr, Cu, Ta, Ti, Mo, or W.

In addition, preferably, the semiconductor layer and the oxide layer each include an In-M-Zn oxide (M is an element of Al, Ti, Ga, Y, Zr, La, Ce, Nd, and Hf), and the proportion of the element M to In included in the oxide layer is higher than the proportion of the element M to In included in the semiconductor layer.

Alternatively, in the oxide layer, the content of the element M is preferably three or more times as large as the content of In.

Alternatively, the oxide layer preferably includes any of gallium oxide, Ga—Zn oxide, silicon oxide, silicon oxynitride, silicon nitride oxide, silicon nitride, aluminum oxide, and hafnium oxide.

The semiconductor layer preferably includes a crystal part.

Note that in this specification and the like, the content of a specified element contained in a compound is expressed by an atomic ratio unless otherwise described. The atomic ratio has a margin of error of ±20%.

According to one embodiment of the present invention, a semiconductor device that is suitable for miniaturization can be provided. A highly reliable semiconductor device can also be provided. Furthermore, a semiconductor device formed using an oxide semiconductor can have favorable electrical characteristics.

DETAILED DESCRIPTION OF THE INVENTION

Figure 1A:
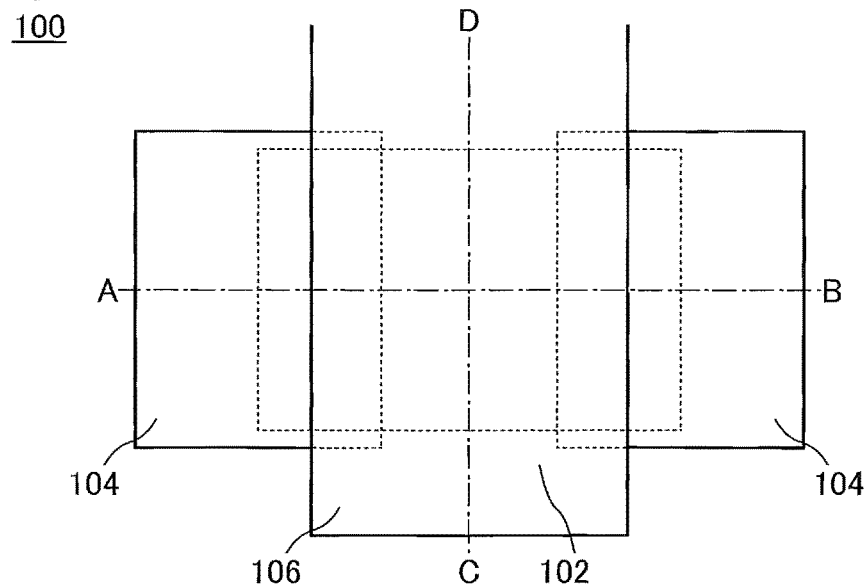
FIGS. 1A to 1C illustrate a semiconductor device according to one embodiment of the present invention.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the present invention described below, the same portions or portions having similar functions are denoted by the same reference numerals in different drawings, and description of such portions is not repeated. In addition, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Embodiment 1

In this embodiment, a structure and a manufacturing method of a transistor, which is an example of a semiconductor device of one embodiment of the present invention, are described with reference to drawings.

Structural Example

Figure 1B:
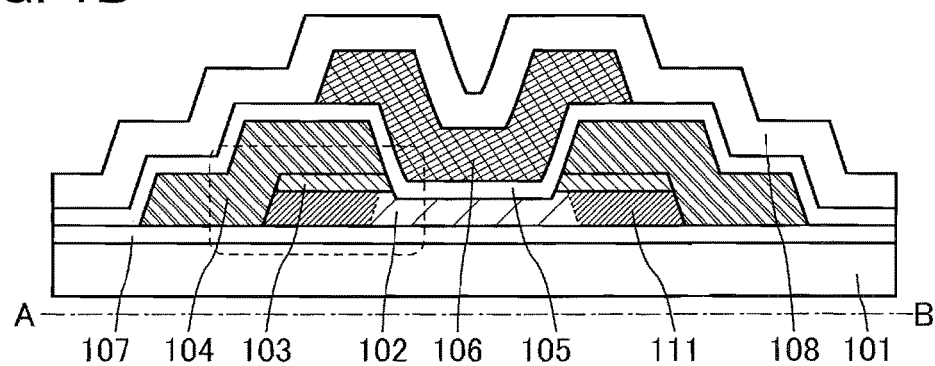
Figure 1C:
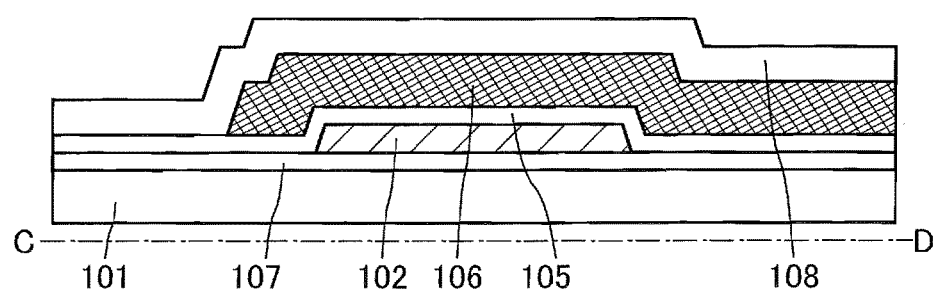

FIG. 1A is a schematic top view of a transistor 100 described in this structural example. FIGS. 1B and 1C are schematic cross-sectional views taken along the section lines A-B and C-D in FIG. 1A. Some components are not illustrated in FIG. 1A for clarity.

The transistor 100 is formed over a substrate 101. The transistor 100 includes an island-shaped semiconductor layer 102; a pair of electrodes 104 in contact with the side surfaces of the semiconductor layer 102 and overlapping with a part of the top surface of the semiconductor layer 102; a pair of oxide layers 103 that is located between the semiconductor layer 102 and the electrodes 104 and is in contact with parts of the top surfaces of the semiconductor layer 102 and parts of the bottom surfaces of the electrode 104; a gate electrode 106 overlapping with the semiconductor layer 102; and a gate insulating layer 105 between the semiconductor layer 102 and the gate electrode 106.

In addition, the semiconductor layer 102 includes a low-resistant region 111 around the side surface thereof that is in contact with the pair of electrodes 104. Note that the boundary line between the low-resistant region 111 included in the semiconductor layer 102 and another region is not clear in some cases and thus the boundary line is illustrated with a broken line.

In addition, an insulating layer 107 is formed over the substrate 101, and the semiconductor layer 102 is formed over the insulating layer 107. An insulating layer 108 is formed to cover the gate insulating layer 105 and the gate electrode 106.

One of the pair of electrodes 104 serves as a source electrode of the transistor 100, and the other of the electrodes 104 serves as a drain electrode.

The semiconductor layer 102 contains an oxide semiconductor. The semiconductor layer 102 preferably contains at least indium (In) or zinc (Zn). Alternatively, both In and Zn are preferably contained. Preferably, the semiconductor layer 102 contains an oxide that is represented as an In-M-Zn oxide (M is a metal such as Al, Ti, Ga, Ge, Y, Zr, Sn, La, Ce, or Hf).

The oxide layer 103 includes at least a metal oxide or a semiconductor oxide. Preferably, the oxide layer 103 includes an oxide that is represented as an In-M-Zn oxide (M is a metal such as Al, Ti, Ga, Ge, Y, Zr, Sn, La, Ce, or Hf). Alternatively, the oxide layer 103 includes a gallium oxide or a Ga—Zn oxide.

For the oxide layer 103, a material that hardly transmits oxygen or a material from which oxygen is hardly released can be used. The material used for the oxide layer 103 preferably exhibits semiconductor characteristics, but may be an insulator, for example, a material including silicon oxide, silicon oxynitride, silicon nitride oxide, silicon nitride, aluminum oxide, or hafnium oxide.

When an In-M-Zn oxide is used for the oxide layer 103, the In-M-Zn oxide is preferably a material that contains M more than In. For example, an oxide that contains M three times, preferably five times, or further preferably eight times as much as In is preferably used.

Furthermore, when In-M-Zn oxides are used for both the semiconductor layer 102 and the oxide layer 103, a material used for the oxide layer 103 preferably contains M more than M contained in a material used for the semiconductor layer 102. For example, an oxide layer used for the oxide layer 103 contains M one and a half times, preferably two times, or further preferably three times as much as M contained in an oxide layer used for the semiconductor layer 102.

The electrode 104 includes a conductive material easily bonded to oxygen at least at a portion in contact with the semiconductor layer 102. Examples of the conductive material are Al, Cr, Cu, Ta, Ti, Mo, W, and the like. Alternatively, nitride of any of these conductive materials may be used. The use of W or Ti with relatively high melting point can raise the upper limit of the temperature in the manufacturing process of the transistor 100, which is preferable. Note that the conductive material which is easily bonded to oxygen includes, in its category, a material to which oxygen is easily diffused.

When such a conductive material and an oxide semiconductor are in contact with each other, oxygen in the oxide semiconductor is partly diffused into the conductive material. Furthermore, when the conductive material and the oxide semiconductor in contact with each other are heated, oxygen is further diffused into the conductive material. Due to such movement of oxygen, oxygen vacancies are generated in a region in the vicinity of the interface between the semiconductor layer 102 and the electrodes 104, so that such regions have n-type conductivity (the low-resistant regions 111 are formed). The low-resistant regions 111 can serve as a source and a drain of the transistor 100.

Figure 2:
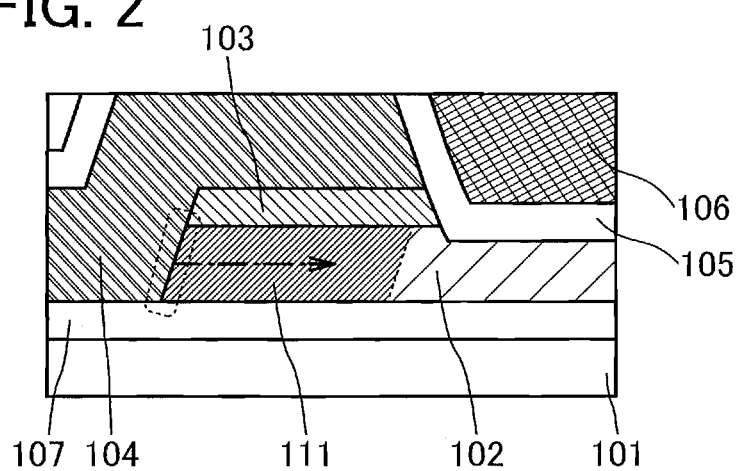
FIG. 2 illustrates a semiconductor device according to one embodiment of the present invention.

FIG. 2 is an enlarged schematic view of a region indicated by the broken line in FIG. 1B. In the top surface of the semiconductor layer 102, the oxide layer 103 is formed between the semiconductor layer 102 and the electrode 104, so that the semiconductor layer 102 is not in a direct contact with the electrode 104. Therefore, as shown by an arrow in FIG. 2, the low-resistant region 111 formed in the semiconductor layer 102 is formed toward the inside of the semiconductor layer 102 in contact with the electrode 104 from the side surface of the semiconductor layer 102.

Here, when an In-M-Zn based oxide containing a large amount of the element M is used for the oxide layer 103, the M contained is strongly bonded to oxygen more than In is, and thus oxygen movement hardly occurs even when the oxide layer 103 is heated while being in contact with the electrode 104. In addition, when a gallium oxide, a Ga—Zn oxide, or the like is used, gallium also has the same property. In other words, oxygen movement from the semiconductor layer 102 to the electrode 104 through the oxide layer 103 can be suppressed.

In addition, a layer containing at least one kind of the constituent elements of the semiconductor layer 102 is used for the oxide layer 103 formed in contact with the top surface of the semiconductor layer 102; therefore, an interface state is less likely to be produced between the oxide layer 103 and the semiconductor layer 102. As a result, variation or fluctuation of electric characteristics such as a threshold voltage of the transistor can be reduced; thus, a highly reliable transistor can be formed.

The distance where the low-resistant region 111 extends toward the inside of the semiconductor layer 102 from the side surface of the semiconductor layer 102 (in other words, the width of the low-resistant region 111) can be controlled by selection of materials of the semiconductor layer 102 and the electrode 104 and under the conditions such as heat treatment conditions after the formation of the electrode 104.

For example, an In—Ga—Zn based oxide containing In, Ga, and Zn at an atomic ratio of 1:1:1 is used for the semiconductor layer 102, tungsten (W) is used for the electrode 104, and heat treatment is performed under nitrogen atmosphere at 400° C. for one hour, so that the low-resistant region 111 can be formed at a portion ranging from the interface between the electrode 104 and the semiconductor layer 102 to 20 nm.

In addition, the oxide layer 103 has a sheet resistance five times, preferably ten times, further preferably fifty times as high as the low-resistant region 111. When the low-resistant region 111 has sufficiently low resistance as compared with the oxide layer 103, the oxide layer 103 does not serve as a source or a drain, and the low-resistant region 111 can serve as a source and a drain. As a result, the effective channel length of the transistor 100 can be determined based on the interval between the low-resistant regions 111. Note that the oxide layer 103 may serve as a source and a drain depending on materials used for the oxide layer 103. Even in this case, oxygen movement from the semiconductor layer 102 to the electrode 104 side through the oxide layer 103 can be suppressed.

Here, the channel length of the transistor will be described. The channel length means the distance between the source and the drain of the transistor in many cases.

Figure 3:
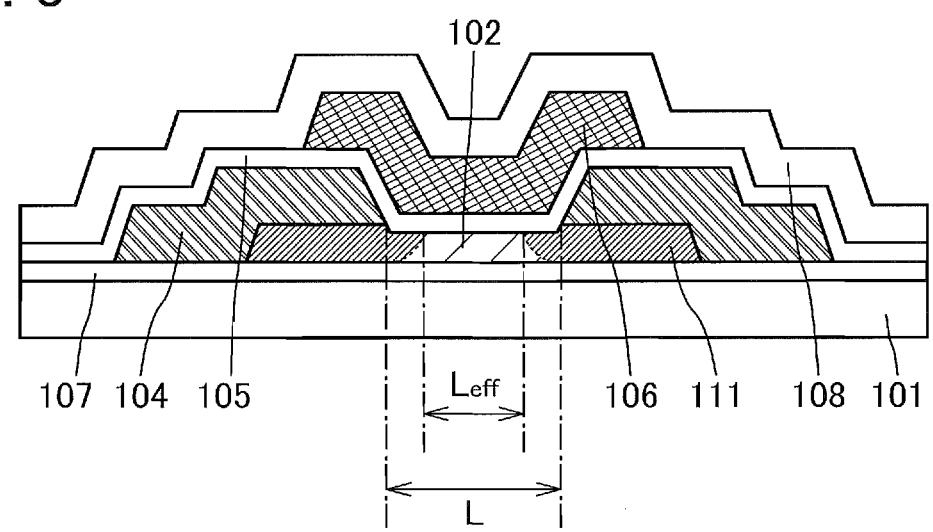
FIG. 3 illustrates a semiconductor device according to one embodiment of the present invention.

FIG. 3 is a schematic cross-sectional view of a transistor not including the oxide layer 103. The low-resistant region 111 is formed in the semiconductor layer 102. The top surface of the semiconductor layer 102 is in contact with the electrode 104, and the low-resistant region 111 is formed throughout the region of the semiconductor layer 102 that overlaps with the electrode 104. Furthermore, in the semiconductor layer 102, the low-resistant region 111 extends to a region (not overlapping with the electrode 104) on the inner side than the end portion of the electrode 104 over the semiconductor layer 102. As a result, the distance $L_{eff}$ between the pair of low-resistant regions 111 in the semiconductor layer 102 is shorter than the distance L between the pair of electrodes 104. Here, $L_{eff}$ corresponds to the effective channel length of the transistor.

In such a structure, it may be difficult to control the depth (distance) of the low-resistant region 111 in the semiconductor layer 102 because of variation of the shape of the electrode 104 at its end portion and the thinning degree of the semiconductor layer 102 in processing of the electrode 104. Therefore, it is difficult to reduce variation of the effective channel length $L_{eff}$ of the transistor and electric characteristics of minute transistor may vary in some cases.

Also in this structure, with miniaturization of the transistor, the distance L between the pair of electrodes 104 in the semiconductor layer 102 is extremely shortened, so that the low-resistant regions 111 in pairs overlaps with each other only to short-circuit the source and the drain electrically, leading to failure to obtain transistor characteristics.

In the transistor 100 illustrated in FIGS. 1A to 1C, the degree of expansion of the low-resistant region 111 in the lateral direction does not depend on the shapes of the electrode 104 and the semiconductor layer 102, leading to reduction in the variation. Therefore, the transistor 100 is more suitable for miniaturization.

Here, the effective channel length $L_{eff}$ of the transistor can be controlled by changing the width in the channel direction of the island-shaped semiconductor layer 102.

Figure 4A:
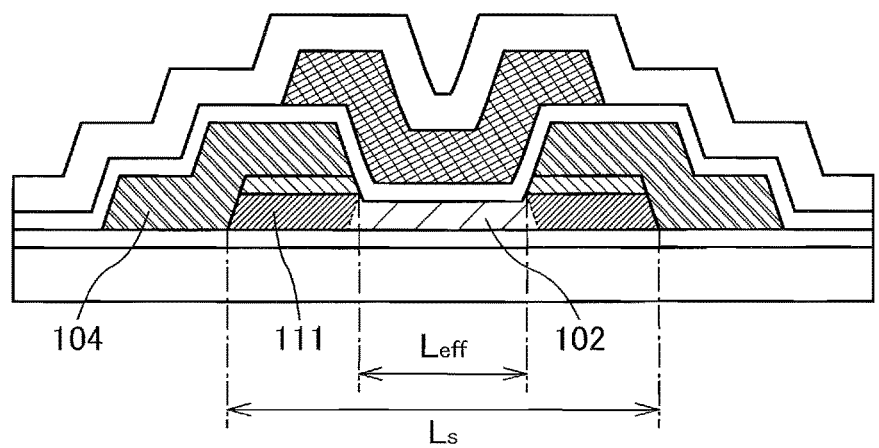
FIGS. 4A to 4C each illustrate a semiconductor device according to one embodiment of the present invention.
Figure 4B:
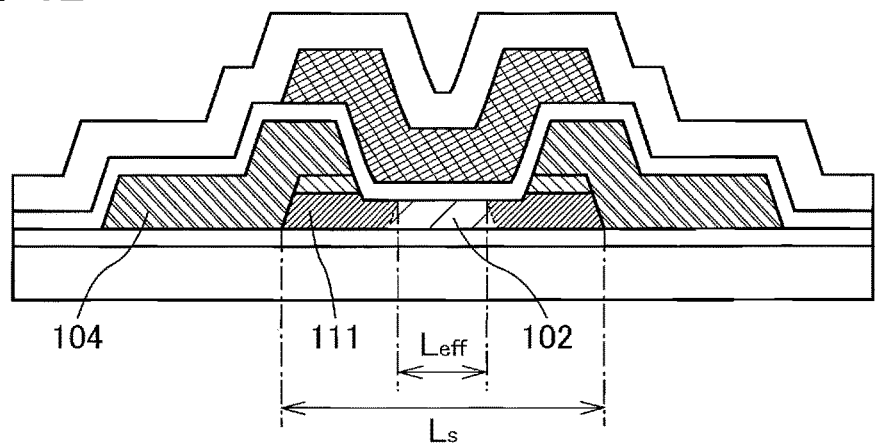
Figure 4C:
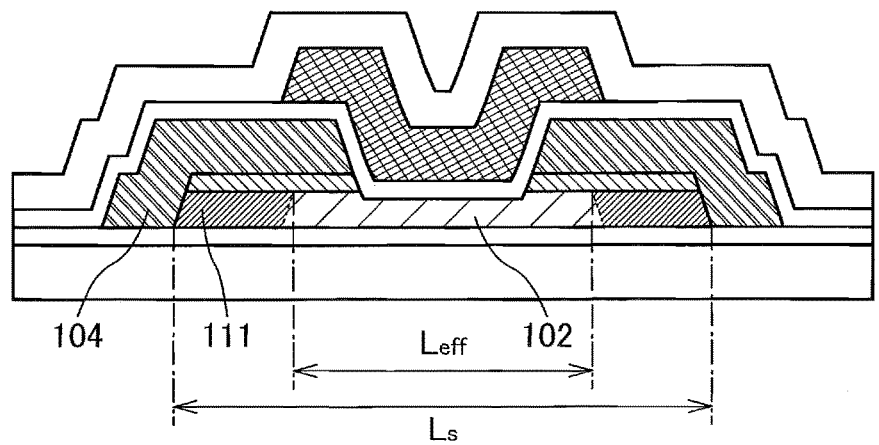

Three schematic cross-sectional views illustrated in FIGS. 4A to 4C are structural examples of transistors 100 where the widths in the channel directions of the semiconductor layers 102 are different.

FIG. 4A illustrates an example where a width $L_s$ in the channel length direction of the semiconductor layer 102 is designed such that the effective channel length $L_{eff}$ is equal to the distance between the pair of electrodes 104.

FIG. 4B illustrates an example where the width $L_s$ is shorter than that in FIG. 4A such that the effective channel length $L_{eff}$ is shorter than the distance between the pair of electrodes 104. Thus, the effective channel length $L_{eff}$ of the transistor 100 can be shortened securely and the transistor 100 can exhibit high on-state current without short-circuiting between the source and the drain.

FIG. 4C illustrates an example where the width $L_s$ is longer than that in FIG. 4A such that the effective channel length $L_{eff}$ is longer than the distance between the pair of electrodes 104. With this structure, in a region of the semiconductor layer 102 other than the low-resistant region 111, an off-set region without being subjected to an electric field of the gate (or with being more difficult to be subjected the electric field than the channel formation region is) can be formed securely without variations. As a result, the source-drain withstand voltage of the transistor can be improved, so that the transistor can exhibit high reliability.

In this manner, the width L of the semiconductor layer 102 in the transistor 100 in the channel length direction can be changed and thus the effective channel length $L_{eff}$ can be formed into a desired length securely.

The effective channel length $L_{eff}$ depends on the width $L_s$ in the channel length direction of the semiconductor layer 102. Thus, for example, even if the distance between the pair of electrodes 104 varies when the electrodes 104 are processed minutely, the electric characteristics of the transistor are hardly influenced.

Note that the low-resistant region 111 is derived from oxygen vacancies formed in the semiconductor layer 102 by oxygen movement from the semiconductor layer 102 to the electrodes 104. The density of the oxygen vacancies in the semiconductor layer 102 is higher at a portion closer to the interface. Accordingly, the resistance is lower at a portion closer to the interface, and the resistance is higher at a portion more distant from the interface, so that a continuous distribution of the conductivity can be exhibited in some cases. For that reason, the boundary line between the low-resistant region 111 and a portion other than the low-resistant region 111 in the semiconductor layer 102 is sometimes not clear.

[Components]

Components of the transistor 100 are described below.

[Semiconductor Layer]

As an oxide semiconductor included in the semiconductor layer 102, an oxide semiconductor having a wider band gap and a lower carrier density than that of silicon is preferably used, in which case off-state leakage current can be reduced.

Further, there is no particular limitation on the crystallinity of a semiconductor used for the semiconductor layer 102, and an amorphous semiconductor or a semiconductor having crystallinity (a microcrystalline semiconductor, a polycrystalline semiconductor, a single crystal semiconductor, a semiconductor partly including crystal regions, or a semiconductor including crystal regions in the whole area) may be used. A semiconductor having crystallinity is preferably used, in which case deterioration of transistor characteristics can be reduced.

Note that details of a preferable mode and a formation method of an oxide semiconductor applicable to the semiconductor layer 102 are described in an embodiment below.

[Substrate]

There is no particular limitation on the property of a material and the like of the substrate 101 as long as the material has heat resistance high enough to withstand at least heat treatment in the process. For example, a glass substrate, a ceramic substrate, a quartz substrate, a sapphire substrate, or an yttria-stabilized zirconia (YSZ) substrate may be used as the substrate 101. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 101.

Still alternatively, a component in which a semiconductor element is provided over any kind of semiconductor substrate or an SOI substrate may be used as the substrate 101. In this case, the transistor 100 is formed over the substrate 101 with an interlayer insulating layer provided therebetween. The transistor 100 in this case may have a structure in which at least one of the gate electrode 106 and the pair of electrodes 104 is electrically connected to the above semiconductor element by a connection electrode buried in the interlayer insulating layer. The transistor 100 is provided over the semiconductor element with the interlayer insulating layer provided therebetween, which does not cause an increase in area due to provision of the transistor 100.

Still alternatively, a flexible substrate such as a plastic substrate may be used as the substrate 101, and the transistor 100 may be provided directly on the flexible substrate. Further alternatively, a separation layer may be provided between the substrate 101 and the transistor 100. The separation layer can be used when part or the whole of the transistor formed over the separation layer is formed and separated from the substrate 101 and transferred to another substrate. Thus, the transistor 100 can be transferred to a substrate having low heat resistance or a flexible substrate.

[Gate Electrode]

The gate electrode 106 can be formed using a metal selected from aluminum, chromium, copper, tantalum, titanium, molybdenum, and tungsten; an alloy containing any of these metals as a component; an alloy containing any of these metals in combination; or the like. Furthermore, either or both metal of manganese and zirconium may be used. Alternatively, a semiconductor typified by polycrystalline silicon doped with an impurity element such as phosphorus, or a silicide such as a nickel silicide may be used. In addition, the gate electrode 106 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film containing aluminum and one or more metals selected from titanium, tantalum, tungsten, molybdenum, chromium, neodymium, and scandium; or a nitride film of the alloy film may be used.

The gate electrode 106 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 106 and the insulating layer 105. These films each have a work function of 5 eV or higher, preferably 5.5 eV or higher, which is higher than the electron affinity of an oxide semiconductor; thus, the threshold voltage of a transistor including the oxide semiconductor can be shifted in the positive direction. Accordingly, a switching element having what is called normally-off characteristics is realized. For example, as an In—Ga—Zn-based oxynitride semiconductor film, an In—Ga—Zn-based oxynitride semiconductor film having a higher nitrogen concentration than at least that of the semiconductor layer 102, specifically an In—Ga—Zn-based oxynitride semiconductor film having a nitrogen concentration higher than or equal to 7 at. %, is used.

[Gate Insulating Layer]

The gate insulating layer 105 may be formed with a single layer or a stack using, for example, one or more of silicon oxide, silicon oxynitride, silicon nitride oxide, aluminum oxide, hafnium oxide, gallium oxide, Ga—Zn-based metal oxide, silicon nitride, and the like.

The gate insulating layer 105 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

[A Pair of Electrodes]

The above-described conductive material which is easily bonded to oxygen may be used for at least part of the pair of electrodes 104 that is in contact with the semiconductor layer 102. Alternatively, a stacked-layer structure in which another conductive material is stacked over the above-described conductive material may be used. For example, a conductive material of nickel, yttrium, zirconium, silver, or the like, nitride of the conductive material, or a transparent conductive material containing indium oxide, tin oxide, or zinc oxide may be used. Still alternatively, a stacked-layer structure of two or more layers formed of the conductive material which is easily bonded to oxygen can be used.

For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given.

[Insulating Layer]

The insulating layer 107 serves as a barrier layer that prevents diffusion of impurities contained in the substrate 101.

At least one of the insulating layers 107 and 108 is preferably formed using an oxide insulating film containing oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis.

With the use of such an insulating film as the insulating layer 107 or the insulating layer 108, oxygen is supplied to the semiconductor layer 102 through heat treatment or the like in the manufacturing process, which makes it possible to reduce oxygen vacancies in the semiconductor layer 102. In particular, such an insulating film is preferably used for the layer (e.g., the insulating layer 107) in contact with the semiconductor layer 102.

As the insulating layer 107 or 108, for example, silicon oxide, silicon oxynitride, or the like can be used.

An oxide film that can transmit oxygen may be provided below the insulating layer 108.

As the oxide film that can transmit oxygen, a silicon oxide film, a silicon oxynitride film, or the like can be formed. Note that in this specification, "silicon oxynitride film" refers to a film that contains more oxygen than nitrogen, and "silicon nitride oxide film" refers to a film that contains more nitrogen than oxygen.

Alternatively, the insulating layer 108 may be formed using an insulating film having a blocking effect against oxygen, hydrogen, water, and the like. It is possible to prevent outward diffusion of oxygen from the semiconductor layer 102 and entry of hydrogen, water, or the like into the semiconductor layer 102 from the outside by providing the insulating layer 108. As for the insulating film having a blocking effect against oxygen, hydrogen, water, and the like, a silicon nitride film, a silicon nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

Note that the insulating layer 108 may have a stacked structure where an insulating film from which part of oxygen is released by heat treatment and an insulating film having a blocking effect against oxygen, hydrogen, water, and the like are stacked. The stacked structure of the insulating layer 108 can improve the blocking effect and the planarity of the upper portion of the transistor 100.

In the case of forming a silicon oxide film or a silicon oxynitride film as the insulating layer 107 or the insulating layer 108 by a plasma CVD method, a deposition gas containing silicon and an oxidizing gas are preferably used as a source gas. Typical examples of the deposition gas containing silicon are silane, disilane, trisilane, and silane fluoride. Examples of the oxidizing gas are oxygen, ozone, dinitrogen monoxide, and nitrogen dioxide.

For example, a silicon oxide film or a silicon oxynitride film is formed under the conditions as follows: the substrate placed in a vacuum-evacuated treatment chamber of a plasma CVD apparatus is held at a temperature higher than or equal to 180° C. and lower than or equal to 260° C., preferably higher than or equal to 200° C. and lower than or equal to 240° C.; a source gas is supplied to the treatment chamber and the pressure in the treatment chamber is set greater than or equal to 100 Pa and less than or equal to 250 Pa, preferably greater than or equal to 100 Pa and less than or equal to 200 Pa; and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the film formation conditions, the high-frequency power having the above power density is supplied to the treatment chamber having the above pressure, whereby the decomposition efficiency of the source gas in plasma is increased, oxygen radicals are increased, and oxidation of the source gas is promoted; therefore, oxygen is contained in the oxide insulating film at a higher proportion than oxygen in the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen at a higher proportion than the stoichiometric composition and from which part of oxygen is released by heating.

In the case where the insulating layer 108 is formed using a silicon nitride film or a silicon nitride oxide film, a deposition gas containing silicon, an oxidizing gas, and a gas containing nitrogen are preferably used as a source gas. Typical examples of the deposition gas containing silicon are silane, disilane, trisilane, and silane fluoride. Examples of the oxidizing gas are oxygen, ozone, dinitrogen monoxide, and nitrogen dioxide. Examples of the gas containing nitrogen are nitrogen and ammonia.

The above is the description of the structural examples of the transistor 100.

[Example of Manufacturing Method]

An example of a method for manufacturing the transistor 100 illustrated in FIG. 1A to 1C is described below with reference to the drawings. FIGS. 5A to 5E are schematic cross-sectional views of steps in the example of the manufacturing method described below.

[Formation of Insulating Layer]

First, the insulating layer 107 is formed over the substrate 101.

The insulating layer 107 is formed by a sputtering method, a chemical vapor deposition (CVD) method, an evaporation method, or the like.

In order to make the insulating layer 107 contain excess oxygen, the insulating layer 107 may be formed in an oxygen atmosphere, for example. Alternatively, the insulating layer 107 may excessively contain oxygen in such a manner that oxygen is supplied into the insulating layer 107 which has been formed. Both the methods may be combined.

For example, oxygen (at least including any of oxygen radicals, oxygen atoms, and oxygen ions) is introduced into the insulating layer 107 which has been deposited, whereby a region excessively containing oxygen is formed. Oxygen can be supplied by an ion implantation method, an ion doping method, a plasma immersion ion implantation method, plasma treatment, or the like.

A gas containing oxygen can be used for supplying oxygen. As the gas containing oxygen, oxygen, dinitrogen monoxide, nitrogen dioxide, carbon dioxide, carbon monoxide, or the like can be used. Further, a dilution gas such as a rare gas may be contained in the gas containing oxygen in the oxygen supply treatment.

[Formation of Semiconductor Film and Oxide Film]

Figure 5A:
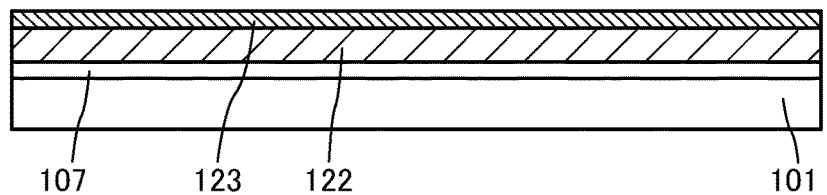
FIGS. 5A to 5E illustrate a method for manufacturing of a semiconductor device according to one embodiment of the present invention.

Next, a semiconductor film 122 and an oxide film 123 are formed over the insulating layer 107 (FIG. 5A).

The semiconductor film 122 and the oxide film 123 can be formed by a sputtering method, a CVD method, a molecular beam epitaxy (MBE) method, an atomic layer deposition (ALD) method, a pulsed laser deposition (PLD) method, or the like. Alternatively, a technique for formation of a thin film using a liquid material, such as a sol-gel method, a spray method, or a mist method, can be used. The semiconductor film 122 is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

Note that heat treatment may be performed after the formation of the semiconductor film 122. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidization gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. By the heat treatment, oxygen is supplied from the insulating layer 107 to the semiconductor film 122 (or the semiconductor layer 102), which enables a reduction in oxygen vacancies in the oxide semiconductor included in the semiconductor layer 102. Note that the heat treatment may be performed at any timing after the formation of the semiconductor film 122. The heat treatment may be performed before the processing of the semiconductor film 122 or may be performed after the formation of the semiconductor layer 102 by the processing of the semiconductor film 122.

The oxide film 123 is preferably formed successively after the formation of the semiconductor film 122 without exposing its surface to air. By the successive formation of the films, the interface states between the semiconductor layer 102 and the oxide layer 103 can be reduced.

[Formation of Semiconductor Layer and Oxide Layer]

Figure 5B:
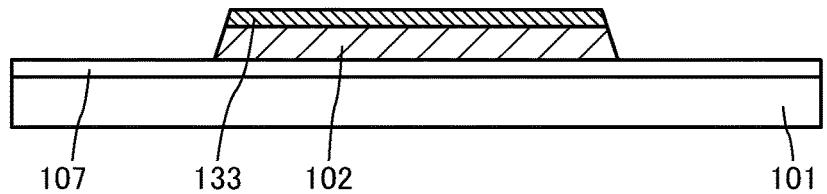

Then, a resist mask is formed over the oxide film 123 by a photolithography process or the like, and unnecessary portions of the oxide film 123 and the semiconductor film 122 are removed by etching. After that, the resist mask is removed, and thus a stacked body of the island-shaped semiconductor layer 102 and the island-shaped oxide layer 133 is formed (FIG. 5B).

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme EUV, X-rays, or an electron beam because extremely minute processing can be performed. Note that in the case of performing exposure by scanning a beam such as an electron beam, a photomask is not needed.

[Formation of a Pair of Electrodes]

Next, a conductive film is formed over the insulating layer 107 and the oxide layer 133 so as to be in contact with the side surface of the semiconductor layer 102. Then, a resist mask is formed over the conductive film by a photolithography process or the like. Then, unnecessary portions of the conductive film and the oxide layer 133 are removed by etching. The resist mask is removed, and thus the pair of electrodes 104 and the oxide layer 103 located between the electrode 104 and the semiconductor layer 102 are formed (FIG. 5C).

The conductive film is formed by a sputtering method, a vapor deposition method, a CVD method, or the like.

Figure 5C:
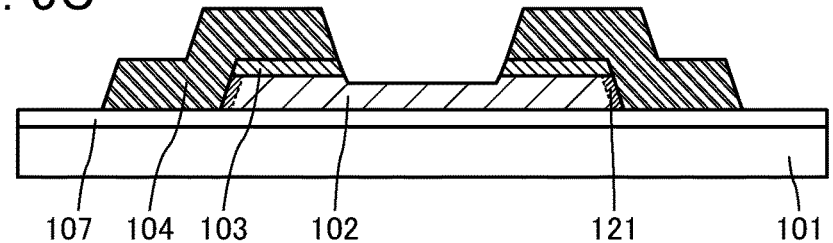

As illustrated in FIG. 5C, a part of the upper portion of the semiconductor layer 102 is etched when the conductive film and the oxide layer 133 are etched, and thereby the portion not overlapping with the pair of electrodes 104 may be thinned. For this reason, the thickness of the semiconductor film serving as the semiconductor layer 102 is preferably large in light of the etching depth.

Note that the etching of the oxide layer 133 using the resist mask as the etching mask is described here, but the resist mask may be removed after the conductive film is etched and the pair of electrodes 104 may be used as the etching mask to etch the oxide layer 133.

As illustrated in FIG. 5C, after the formation of the conductive film, the end portion of the conductive film may be in contact with the end portion of the semiconductor layer 102, so that a low-resistant region 121 may be formed in a part of the end portion of the semiconductor layer 102. The low-resistant region 121 formed at this time does not expand so much (e.g., expands several nanometers) in the channel length direction and is formed in the vicinity of the interface between the conductive film or the electrode 104 and the semiconductor layer 102.

[Formation of Gate Insulating Layer]

Then, the gate insulating layer 105 is formed over the semiconductor layer 102, the oxide layer 103, the insulating layer 107, and the pair of electrodes 104.

The gate insulating layer 105 can be formed by a sputtering method, a CVD method, an MBE method, an ALD method, a PLD method, or the like. In particular, it is preferable that the gate insulating layer 105 be formed by a CVD method, further preferably a plasma CVD method because coverage can be further improved.

In addition, after the formation of the gate insulating layer 105, the oxygen supply treatment described above may be performed on the gate insulating layer 105. Oxygen is supplied into the gate insulating layer 105 so that the gate insulating layer 105 can contain excess oxygen, and thus oxygen can be supplied into the semiconductor layer 102 in later heat treatment.

[Formation of Gate Electrode]

Figure 5D:
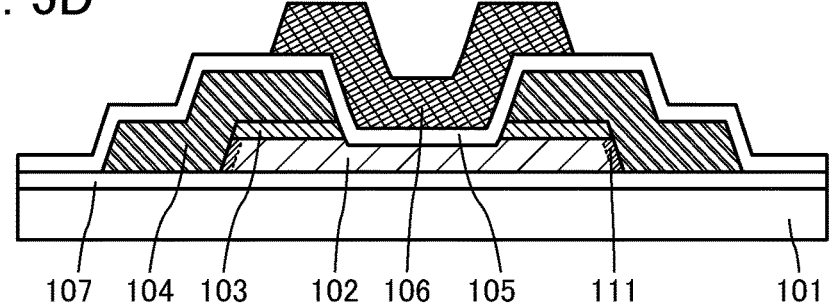

A conductive film is formed over the gate insulating layer 105. A resist mask is formed over the conductive film by a photolithography process or the like and unnecessary portions of the conductive film are etched, and then the resist mask is removed. In this manner, the gate electrode 106 can be formed (FIG. 5D).

The conductive film serving as the gate electrode 106 can be formed by a sputtering method, a CVD method, a vapor deposition method, or the like, for example.

[Formation of Insulating Layer]

Next, the insulating layer 108 is formed over the gate insulating layer 105 and the gate electrode 106.

The insulating layer 108 can be formed by a sputtering method, a CVD method, an MBE method, an ALD method, a PLD method, or the like. In particular, it is preferable that the insulating layer 108 be formed by a CVD method, further preferably a plasma CVD method because coverage can be excellent.

[Heat Treatment]

Figure 5E:
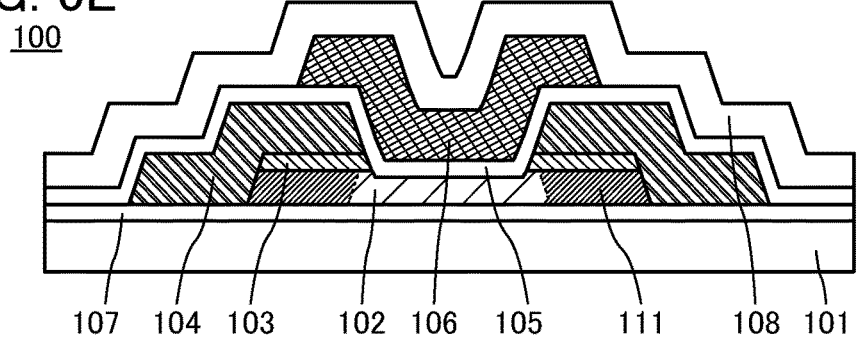

Next, heat treatment is performed. By the heat treatment, at an end portion of the semiconductor layer 102 in contact with the electrode 104, part of oxygen moves into the electrode 104 from the semiconductor layer 102, and oxygen vacancies are produced at the end portion of the semiconductor layer 102 along the channel length direction; therefore, the low-resistant region 111 is formed in the semiconductor layer 102 (FIG. 5E).

The width in the channel length direction and the distribution of conductivity of the low-resistant region 111 formed in the semiconductor layer 102 can be controlled with conditions such as the temperature, time, pressure, and atmosphere of heat treatment. The heat treatment may be performed under the above-described conditions.

In addition, oxygen released from the insulating layer 107 (or the gate insulating layer 105 or the insulating layer 108) is supplied into the semiconductor layer 102 by the heat treatment, and thus oxygen vacancies at least in a channel-formation region in the semiconductor layer 102 can be reduced.

Here, the heat treatment is performed after the insulating layer 108 is formed; however, the heat treatment can be performed to form the low-resistant region 111 in any step after the conductive film serving as the pair of electrodes 104 is formed. However, the heat treatment is preferably performed after the formation of the insulating layer 108 (at least after the formation of the gate insulating layer 105) in order to prevent oxygen from being released from the semiconductor layer 102 and oxygen vacancies from being produced in the channel-formation region by the heat treatment.

When the heat treatment is performed after the gate insulating layer 105 is formed, impurities such as water and hydrogen contained in the gate insulating layer 105 can be removed (dehydrated or dehydrogenated).

Through the above steps, the transistor 100 can be manufactured.

[Examples of Variations]

A structural example of a transistor that has a partly different structure from the transistor 100 described in the above structural example is described below. Note that description of the portions already described is omitted and only different portions are described. Even when positions and shapes of components are different from those in the above example, the same reference numerals are used as long as the components have the same functions as those in the above example, and detailed description thereof is omitted in some cases.

[Variation 1]

Figure 6A:
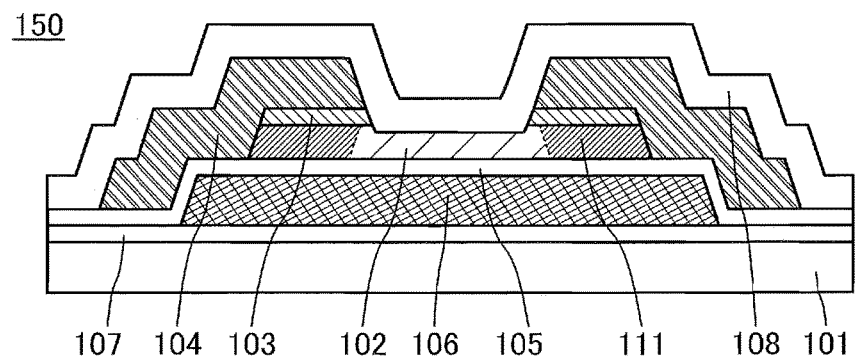
FIGS. 6A to 6C each illustrate a semiconductor device according to one embodiment of the present invention.

FIG. 6A is a schematic cross-sectional view of the transistor 150 exemplified below. The transistor 150 is different from the transistor 100 mainly in that the gate electrode 106 is located on the substrate 101 side, not the semiconductor layer 102 side. The transistor 150 is a bottom-gate type transistor.

The transistor 150 includes the gate electrode 106 over the insulating layer 107; the gate insulating layer 105 covering the gate electrode 106; the semiconductor layer 102 having the low-resistant region 111 over the gate insulating layer 105; the pair of oxide layers 103 in contact with the top surface of the semiconductor layer 102; and the pair of electrodes 104 in contact with the top surface of the oxide layer 103 and the side surface of the semiconductor layer 102. In addition, the insulating layer 108 is formed over the pair of electrodes 104 and the semiconductor layer 102.

[Variation 2]

Figure 6B:
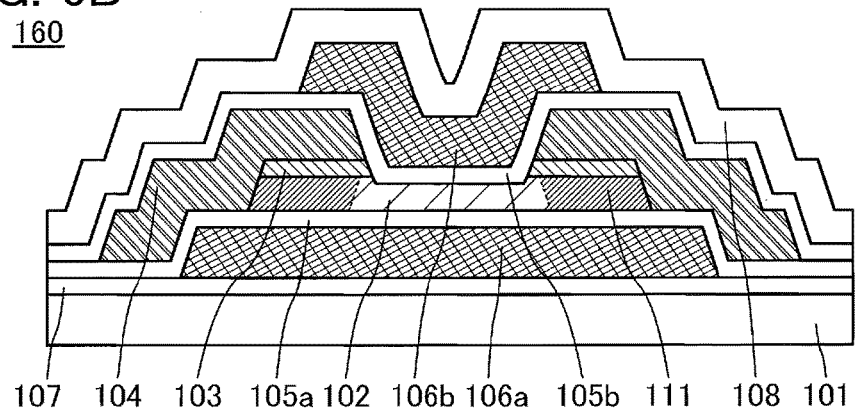

FIG. 6B is a schematic cross-sectional view of a transistor 160 exemplified below. The transistor 160 is different from the transistors 100 and 150 mainly in that the transistor 160 includes two gate electrodes (a first gate electrode 106a and a second gate electrode 106b).

The transistor 160 includes the first gate electrode 106a over the insulating layer 107; a first gate insulating layer 105a covering the first gate electrode 106a; the semiconductor layer 102 having the low-resistant region 111 over the first gate insulating layer 105a; the pair of oxide layers 103 in contact with the top surface of the semiconductor layer 102; the pair of electrodes 104 in contact with the top surface of the oxide layer 103 and the side surface of the semiconductor layer 102; a second gate insulating layer 105b over the pair of electrodes 104 and the semiconductor layer 102; and the second gate electrode 106b overlapping with the semiconductor layer 102 over the second gate insulating layer 105b. In addition, the insulating layer 108 is formed over the second gate insulating layer 105b and the second gate electrode 106b.

Here, preferably, the first gate insulating layer 105a and the second gate insulating layer 105b are formed using the same material and have substantially the same thickness.

The first gate electrode 106a and the second gate electrode 106b may be supplied with different potentials or may be electrically connected and supplied with the same potential. The threshold voltage of the transistor 160 can be varied by supplying a constant potential to one of the first gate electrode 106a and the second gate electrode 106b and supplying a different potential to the other.

[Variation 3]

Figure 6C:
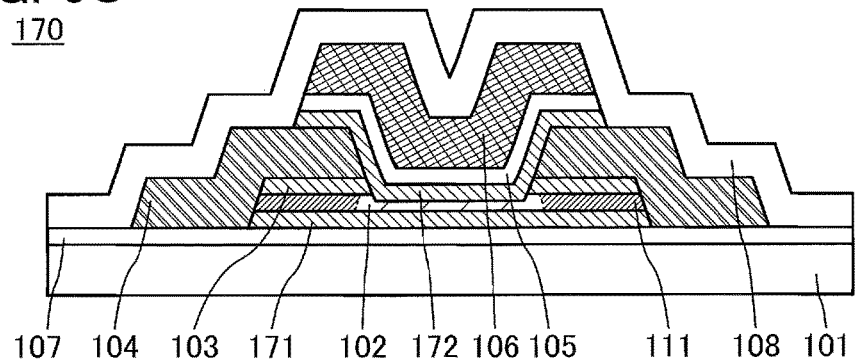

FIG. 6C is a schematic cross-sectional diagram of a transistor 170 exemplified below. The transistor 170 is different from the transistor 100 mainly in that oxide layers are formed above and below the semiconductor layer 102.

The transistor 170 includes an oxide layer 171 over the insulating layer 107; the semiconductor layer 102 having the low-resistant region 111 over the oxide layer 171; the pair of oxide layers 103 in contact with the top surface of the semiconductor layer 102; the pair of electrodes 104 in contact with the top surface of the oxide layer 103 and the side surface of the semiconductor layer 102; an oxide layer 172 over the pair of electrodes 104 and the semiconductor layer 102; the gate insulating layer 105 over the oxide layer 172; and the gate electrode 106 over the gate insulating layer 105. In addition, the insulating layer 108 is formed over the pair of electrodes 104 and the gate electrode 106.

The oxide layer 171 and the oxide layer 172 each contain at least one kind of the constituents of the semiconductor layer 102.

Note that the boundary line between the semiconductor layer 102 and the oxide layer 171 and the boundary line between the semiconductor layer 102 and the oxide layer 172 are not clear in some cases.

For example, the oxide layer 171 and the oxide layer 172 contain In or Ga; typically, a material such as an In—Ga oxide, an In—Zn oxide, or an In-M-Zn oxide (M is Al, Ti, Ga, Y, Zr, La, Ce, Nd, or Hf) that has an energy level of the conduction band minimum closer to the vacuum level than that of the semiconductor layer 102 is used. Typically, the difference in the conduction band minimum energy between the oxide layer 171 and the oxide layer 172 and the semiconductor layer 102 is preferably 0.05 eV or more, 0.07 eV or more, 0.1 eV or more, or 0.15 eV or more and 2 eV or less, 1 eV or less, 0.5 eV or less, or 0.4 eV or less.

For each of the oxide layer 171 and the oxide layer 172 between which the semiconductor layer 102 is sandwiched, an oxide that contains a larger amount of Ga serving as a stabilizer than that of the semiconductor layer 102 is used, which can suppress release of oxygen from the semiconductor layer 102.

Therefore, oxygen movement from the oxide layer 171 and the oxide layer 172 to the electrode 104 is suppressed and thus almost no low-resistant regions are formed in the oxide layer 171 and the oxide layer 172. Accordingly, even in the structure where the oxide layer 171 and oxide layer 172 are provided, the effective channel length of the transistor 170 can be controlled by the width in the channel length direction of the semiconductor layer 102.

When an In—Ga—Zn-based oxide in which the atomic ratio of In to Ga and Zn is 1:1:1 or 3:1:2 is used for the semiconductor layer 102, for example, an In—Ga—Zn-based oxide in which the atomic ratio of In to Ga and Zn is 1:3:2, 1:3:4, 1:3:6, 1:6:4, 1:6:8, 1:6:10, or 1:9:6 can be used for the oxide layer 171 or the oxide layer 172. Note that the atomic ratios in the semiconductor layer 102, the oxide layer 171, and the oxide layer 172 each have a margin of error of ±20%. For the oxide layers 171 and 172, materials with the same composition ratio or materials with different composition ratios may be used.

By using a material in which the energy level of the conduction band minimum is closer to the vacuum level than that of the semiconductor layer 102 is for the oxide layers 171 and 172, a channel is mainly formed in the semiconductor layer 102, so that the semiconductor layer 102 serves as a main current path. When the semiconductor layer 102 in which a channel is formed is sandwiched between the oxide layers 171 and 172 as described above, generation of interface states between these layers is suppressed, and thus reliability of electrical characteristics of the transistor is improved.

Note that, without limitation to the compositions and materials described above, a material with an appropriate composition may be used depending on required semiconductor characteristics and electrical characteristics (e.g., field-effect mobility and threshold voltage) of a transistor. Further, in order to obtain the required semiconductor characteristics of the transistor, it is preferable that the carrier density, the impurity concentration, the defect density, the atomic ratio of a metal element to oxygen, the interatomic distance, the density, and the like of the semiconductor layer 102, the oxide layer 171, and the oxide layer 172 be set to appropriate values.

In addition, in the transistor 170, the oxide layer 172, the gate insulating layer 105, and the gate electrode 106 are processed with the use of the same photomask such that the end portion of the oxide layer 172 and the end portion of the gate insulating layer 105 substantially are aligned with the end portion of the gate electrode 106. The insulating layer 108 is provided in contact with the side surface of the oxide layer 172 and the side surface of the gate insulating layer 105. Such a structure can inhibit release of oxygen from the semiconductor layer 102 through the end portion of the oxide layer 172 and the end portion of the gate insulating layer 105.

The above is the description of the example of variation.

Note that this embodiment can be combined with any of the other embodiments and examples described in this specification as appropriate.

Embodiment 2

An oxide semiconductor that can be favorably used for a semiconductor device of one embodiment of the present invention is described in this embodiment.

An oxide semiconductor has a wide energy gap of 3.0 eV or more. A transistor including an oxide semiconductor film obtained by processing of the oxide semiconductor in an appropriate condition and having extremely lowered carrier density of the oxide semiconductor can have much lower leakage current between a source and a drain in an off state (off-state current) than a conventional transistor including silicon.

An applicable oxide semiconductor preferably contains at least indium (In) or zinc (Zn). In particular, In and Zn are preferably contained. In addition, as a stabilizer for reducing variation in electric characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In, Ga, and Zn. The In—Ga—Z-based oxide may contain another metal element in addition to In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material represented by a chemical formula, $In_2SnO_5(ZnO)_n$ (n>0, n is a natural number) may be used.

For example, an In—Ga—Zn-based oxide with an atomic ratio of In:Ga:Zn=1:1:1, In:Ga:Zn=1:3:2, In:Ga:Zn=1:3:4, In:Ga:Zn=1:3:6, In:Ga:Zn=3:1:2, or In:Ga:Zn=2:1:3, or an oxide with an atomic ratio close to the above atomic ratios can be used.

When the oxide semiconductor film contains a large amount of hydrogen, the hydrogen and oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the drain current at the time when the transistor including an oxide semiconductor film is in an off-state can be less than or equal to $1\times10^{-18}$ A, preferably less than or equal to $1\times10^{-21}$ A, further preferably less than or equal to $1\times10^{-24}$ A at room temperature (about 25° C.); or less than or equal to $1\times10^{-15}$ A, preferably less than or equal to $1\times10^{-18}$ A, further preferably less than or equal to $1\times10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1V or more, 2V or more, or 3V or more.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (θ scan) is performed under conditions where the sample is rotated around a normal vector of a sample surface as an axis (θ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when θ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

In addition, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, in the CAAC-OS film to which an impurity is added, a region to which the impurity is added may be deformed, and the proportion of the c-axis aligned crystal parts in the CAAC-OS film may vary depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than that of an amorphous oxide semiconductor film. Note that there is no regularity of crystal orientation between different crystal parts in the nc-OS film. However, there is no regularity of crystal orientation between different crystal parts in the nc-OS film; hence, the nc-OS film has a higher density of defect states than that of the CAAC-OS film.

Note that an oxide semiconductor film may be a stacked film including two or more kinds of an amorphous oxide semiconductor film, a microcrystalline oxide semiconductor film, and a CAAC-OS film, for example.

This embodiment can be combined with any of the other embodiments disclosed in this specification as appropriate.

Embodiment 3

In this embodiment, an example of a semiconductor device (memory device) that includes a transistor according to one embodiment of the present invention, that can hold stored data even when not powered, and that has an unlimited number of write cycles will be described with reference to drawings.

Figure 7A:
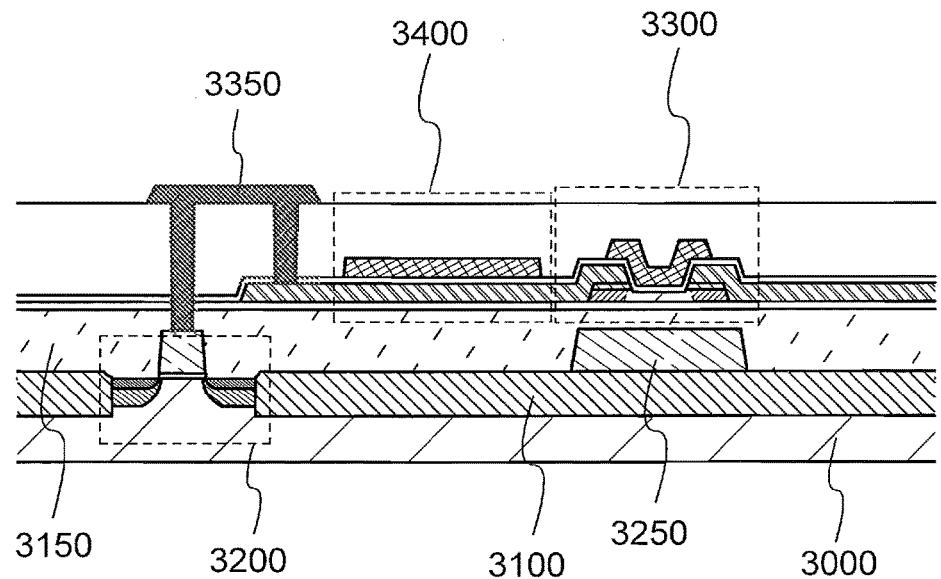
FIGS. 7A and 7B are a cross-sectional view and a circuit diagram, respectively, of a semiconductor device according to one embodiment of the present invention.
Figure 7B:
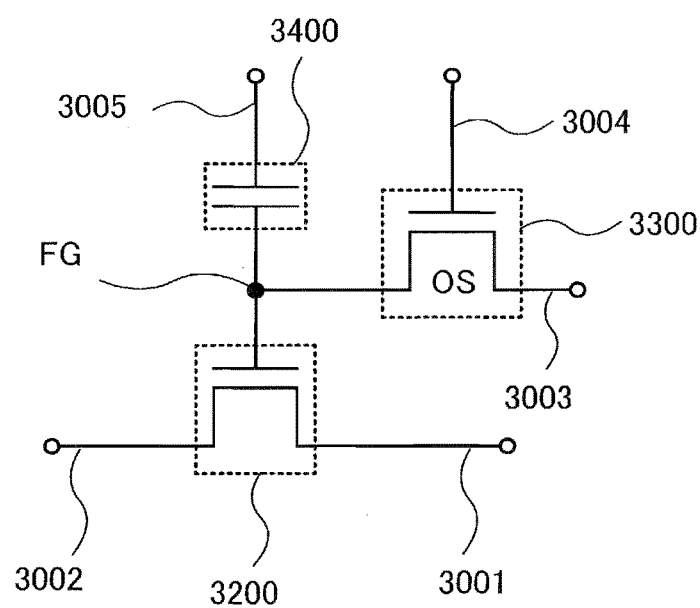

FIG. 7A is a cross-sectional view of the semiconductor device, and FIG. 7B is a circuit diagram of the semiconductor device.

The semiconductor device illustrated in FIGS. 7A and 7B includes a transistor 3200 including a first semiconductor material in a lower portion, and a transistor 3300 including a second semiconductor material and a capacitor 3400 in an upper portion. Note that the transistor described in Embodiment 1 can be used as the transistor 3300. FIG. 7A illustrates an example where the transistor 100 is used.

One electrode of the capacitor 3400 is formed using the same material as a source electrode layer and a drain electrode layer of the transistor 3300, the other electrode of the capacitor 3400 is formed using the same material as a gate electrode layer of the transistor 3300, and a dielectric of the capacitor 3400 is formed using the same material as the gate insulating layer of the transistor 3300; thus, the capacitor 3400 can be formed at the same time as the transistor 3300.

Here, the first semiconductor material and the second semiconductor material are preferably materials having different band gaps. For example, the first semiconductor material may be a semiconductor material (such as silicon) other than an oxide semiconductor, and the second semiconductor material may be the oxide semiconductor described in Embodiment 1. A transistor including a material other than oxide semiconductor, such as single crystal silicon, can operate at high speed easily. On the other hand, a transistor including an oxide semiconductor enables charge to be held for a long time owing to its electrical characteristics, that is, the low off-state current.

Although all the transistors are n-channel transistors here, it is needless to say that p-channel transistors can also be used. The specific structure of the semiconductor device, such as the material used for the semiconductor device and the structure of the semiconductor device, is not necessarily limited to those described here except for the use of the transistor described in Embodiment 1 that is formed using an oxide semiconductor for holding data.

The transistor 3200 in FIG. 7A includes a channel formation region provided in a substrate 3000 including a semiconductor material (such as crystalline silicon), impurity regions provided such that the channel formation region is sandwiched therebetween, intermetallic compound regions provided in contact with the impurity regions, a gate insulating layer provided over the channel formation region, and a gate electrode provided over the gate insulating layer. Note that a transistor whose source electrode and drain electrode are not illustrated explicitly in a drawing may be referred to as a transistor for the sake of convenience. In such a case, in description of connection relation of a transistor, a source region and a source electrode are collectively referred to as a "source electrode," and a drain region and a drain electrode are collectively referred to as a "drain electrode". That is, in this specification, the term "source electrode" may include a source region.

Further, an element isolation insulating layer 3100 is formed on the substrate 3000 so as to surround the transistor 3200, and an insulating layer 3150 is formed so as to cover the transistor 3200. Note that the element isolation insulating layer 3100 can be formed by an element isolation technique such as local oxidation of silicon (LOCOS) or shallow trench isolation (STI).

For example, in the case where the transistor 3200 is formed using a crystalline silicon substrate, the transistor 3200 can operate at high speed. Thus, when the transistor is used as a reading transistor, data can be read at a high speed.

The transistor 3300 is provided over the insulating layer 3150, and one of the source electrode and the drain electrode thereof is extended so as to function as the one electrode of the capacitor 3400. In addition, the one electrode of the capacitor 3400 is electrically connected to the gate electrode of the transistor 3200 through a connection wiring 3350.

The transistor 3300 in FIG. 7A is a top-gate transistor in which a channel is formed in a semiconductor layer including an oxide semiconductor. Since the off-state current of the transistor 3300 is low, stored data can be retained for a long period owing to such a transistor. In other words, power consumption can be sufficiently reduced because a semiconductor device in which refresh operation is unnecessary or the frequency of refresh operation is extremely low can be provided.

Further, an electrode 3250 overlaps with the transistor 3300 with the insulating layer 3150 provided therebetween. By supplying an appropriate potential to the electrode 3250 to be used as a second gate electrode, the threshold voltage of the transistor 3300 can be controlled. In addition, long-term reliability of the transistor 3300 can be improved. When the electrode operates with the same potential as that of the gate electrode of the transistor 3300, on-state current can be increased. Note that the electrode 3250 is not necessarily provided.

The transistor 3300 and the capacitor 3400 can be formed over the substrate over which the transistor 3200 is formed as illustrated in FIG. 7A, which enables the degree of the integration of the semiconductor device to be increased.

An example of a circuit configuration corresponding to FIG. 7A is illustrated in FIG. 7B.

In FIG. 7B, a first wiring 3001 is electrically connected to a source electrode layer of the transistor 3200. A second wiring 3002 is electrically connected to a drain electrode layer of the transistor 3200. A third wiring 3003 is electrically connected to the one of the source electrode and the drain electrode of the transistor 3300. A fourth wiring 3004 is electrically connected to the gate electrode of the transistor 3300. The gate electrode of the transistor 3200 and the other of the source electrode and the drain electrode of the transistor 3300 are electrically connected to the one electrode of the capacitor 3400. A fifth wiring 3005 is electrically connected to the other electrode of the capacitor 3400. Note that a component corresponding to the electrode 3250 is not illustrated.

The semiconductor device in FIG. 7B utilizes a feature that the potential of the gate electrode of the transistor 3200 can be held, and thus enables writing, storing, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, charge for supplying either of two different potential levels (hereinafter referred to as low-level charge and high-level charge) is given. After that, the potential of the fourth wiring 3004 is set to a potential at which the transistor 3300 is turned off, so that the transistor 3300 is turned off. Thus, the charge supplied to the gate electrode of the transistor 3200 is retained (retaining).

Since the off-state current of the transistor 3300 is extremely low, the charge of the gate electrode of the transistor 3200 is retained for a long time.

Next, reading of data will be described. By supplying an appropriate potential (a reading potential) to the fifth wiring 3005 while supplying a predetermined potential (a constant potential) to the first wiring 3001, the potential of the second wiring 3002 varies depending on the amount of charge held in the gate electrode of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold voltage refers to the potential of the fifth wiring 3005 which is needed to turn on the transistor 3200. Thus, by setting the potential of the fifth wiring 3005 to a potential $V_0$ which is between $V_{th\_H}$ and $V_{th\_L}$ (e.g., $V_0$=ground potential GND), charge given to the gate electrode of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Therefore, the data stored in the gate electrode can be read by determining the potential of the second wiring 3002.

Note that in the case where memory cells are arrayed, only data of desired memory cells needs to be read. The fifth wiring 3005 in the case where data is not read may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode layer, that is, a potential higher than $V_{th\_L}$.

When a transistor having a channel formation region formed using an oxide semiconductor and having extremely small off-state current is applied to the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not arise. In other words, the semiconductor device according to one embodiment of the present invention does not have a limit on the number of times of writing, which has been a problem in a conventional nonvolatile memory, and reliability thereof is drastically improved. Furthermore, data is written depending on the on state and the off state of the transistor, whereby high-speed operation can be easily achieved.

As described above, a miniaturized and highly integrated semiconductor device having favorable electrical characteristics can be provided.

Note that this embodiment can be combined with any of the other embodiments and examples described in this specification as appropriate.

Embodiment 4

In this embodiment, a semiconductor device that includes a transistor of one embodiment of the present invention, that can hold stored data even when not powered, that does not have a limitation on the number of write cycles, and that has a structure different from that described in Embodiment 3, is described.

Figure 8:
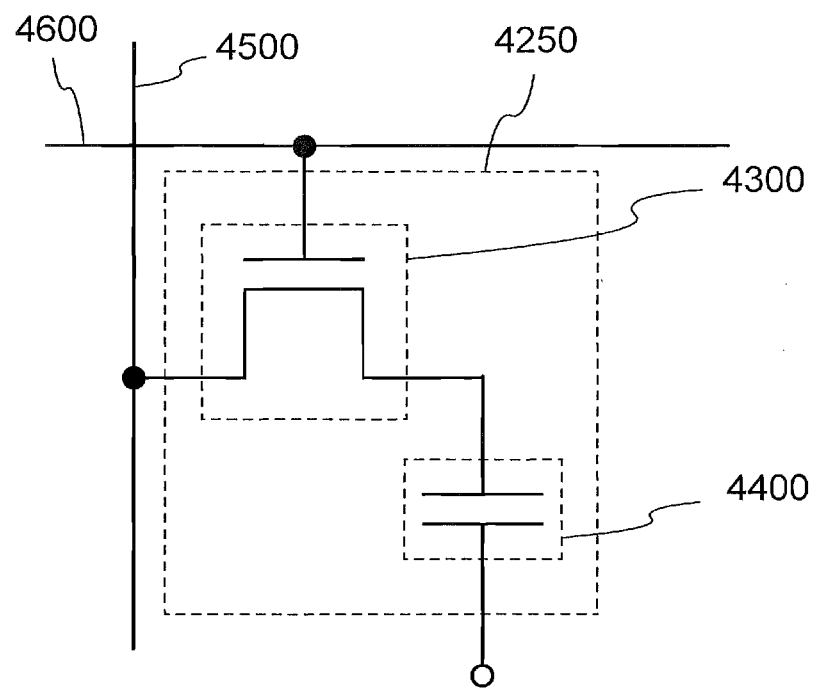
FIG. 8 is a circuit diagram of a semiconductor device according to one embodiment of the present invention.

FIG. 8 illustrates an example of a circuit configuration of the semiconductor device. In the semiconductor device, a first wiring 4500 is electrically connected to a source electrode of a transistor 4300, a second wiring 4600 is electrically connected to a first gate electrode of the transistor 4300, and a drain electrode of the transistor 4300 is electrically connected to a first terminal of a capacitor 4400. Note that the transistor described in Embodiment 1 can be used as the transistor 4300 included in the semiconductor device. The first wiring 4500 can serve as a bit line and the second wiring 4600 can serve as a word line.

The semiconductor device (a memory cell 4250) can have a connection mode similar to that of the transistor 3300 and the capacitor 3400 illustrated in FIGS. 7A and 7B. Thus, the capacitor 4400 can be formed through the same process and at the same time as the transistor 4300 in a manner similar to that of the capacitor 3400 described in Embodiment 3.

Next, writing and holding of data in the semiconductor device (a memory cell 4250) illustrated in FIG. 8 will be described.

First, a potential at which the transistor 4300 is turned on is supplied to the second wiring 4600, so that the transistor 4300 is turned on. Accordingly, the potential of the first wiring 4500 is supplied to one terminal of the capacitor 4400 (writing). After that, the potential of the second wiring 4600 is set to a potential at which the transistor 4300 is turned off, so that the transistor 4300 is turned off. Thus, the potential of the one terminal of the capacitor 4400 is held (holding).

In addition, the transistor 4300 including an oxide semiconductor has an extremely low off-state current. For that reason, the potential of the first terminal of the capacitor 4400 (or a charge accumulated in the capacitor 4400) can be held for an extremely long time by turning off the transistor 4300.

Next, operation of data reading will be described. When the transistor 4300 is turned on, the first wiring 4500 which is in a floating state and the capacitor 4400 are electrically connected to each other, and the charge is redistributed between the first wiring 4500 and the capacitor 4400. As a result, the potential of the first wiring 4500 is changed. The amount of change in potential of the first wiring 4500 varies depending on the potential of the first terminal of the capacitor 4400 (or the charge accumulated in the capacitor 4400).

For example, the potential of the first wiring 4500 after charge redistribution is $(C_B \times V_{B0} + C \times V)(C_B + C)$, where V is the potential of the first terminal of the capacitor 4400, C is the capacitance of the capacitor 4400, $C_B$ is the capacitance component of the first wiring 4500, and $V_{B0}$ is the potential of the first wiring 4500 before the charge redistribution. Therefore, it can be found that assuming that the memory cell 4250 is in either of two states in which the potentials of the first terminal of the capacitor 4400 are $V_1$ and $V_0$ ($V_1 > V_0$), the potential of the first wiring 4500 in the case of holding the potential $V_1$ ($=(C_B \times V_{B0} + C \times V_1)(C_B + C)$) is higher than the potential of the first wiring 4500 in the case of holding the potential $V_0$ ($=(C_B \times V_{B0} + C \times V_0)(C_B + C)$).

Then, by comparing the potential of the first wiring 4500 with a predetermined potential, data can be read.

As described above, the semiconductor device (the memory cell 4250) illustrated in FIG. 8 can hold charge that is accumulated in the capacitor 4400 for a long time because the off-state current of the transistor 4300 is extremely low. In other words, power consumption can be sufficiently reduced because refresh operation becomes unnecessary or the frequency of refresh operation can be extremely low. Moreover, stored data can be stored for a long time even when power is not supplied.

A substrate over which a driver circuit for the memory cell 4250 is formed and the memory cell 4250 illustrated in FIG. 8 are preferably stacked. When the memory cell 4250 and the driver circuit are stacked, the size of the semiconductor device can be reduced. Note that there is no limitation on the numbers of the memory cells 4250 and the driver circuits that are stacked.

It is preferable that a semiconductor material of a transistor included in the driver circuit be different from that of the transistor 4300. For example, silicon, germanium, silicon germanium, silicon carbide, gallium arsenide, or the like can be used, and a single crystal semiconductor is preferably used. A transistor formed using such a semiconductor material can operate at higher speed than a transistor formed using an oxide semiconductor and is suitable for the driver circuit for the memory cell 4250.

As described above, a miniaturized and highly integrated semiconductor device having favorable electrical characteristics can be provided.

Note that this embodiment can be combined with any of the other embodiments and examples described in this specification as appropriate.

Embodiment 5

In this embodiment, a CPU in which at least the transistor described in the above embodiment can be used and the memory device described in the above embodiment is included will be described.

Figure 9:
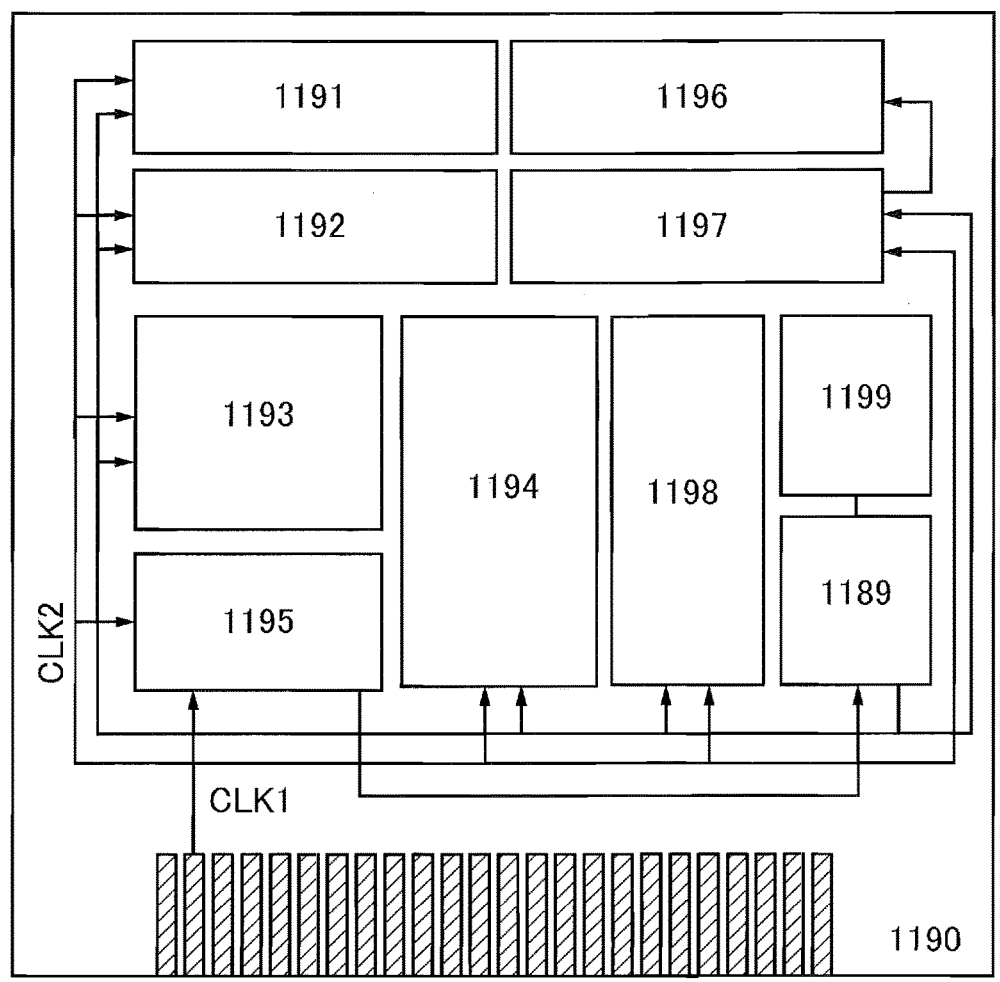
FIG. 9 is a block diagram of a semiconductor device according to one embodiment of the present invention.

FIG. 9 is a block diagram illustrating a configuration example of a CPU using at least the transistor described in Embodiment 1.

The CPU illustrated in FIG. 9 includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 9 is just an example in which the configuration is simplified, and actual CPUs may have various configurations depending on the application. For example, the CPU may have the following configuration: a structure including the CPU illustrated in FIG. 9 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 9, a memory cell is provided in the register 1196. For the memory cell of the register 1196, any of the transistors described in the above embodiment can be used.

In the CPU illustrated in FIG. 9, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 10:
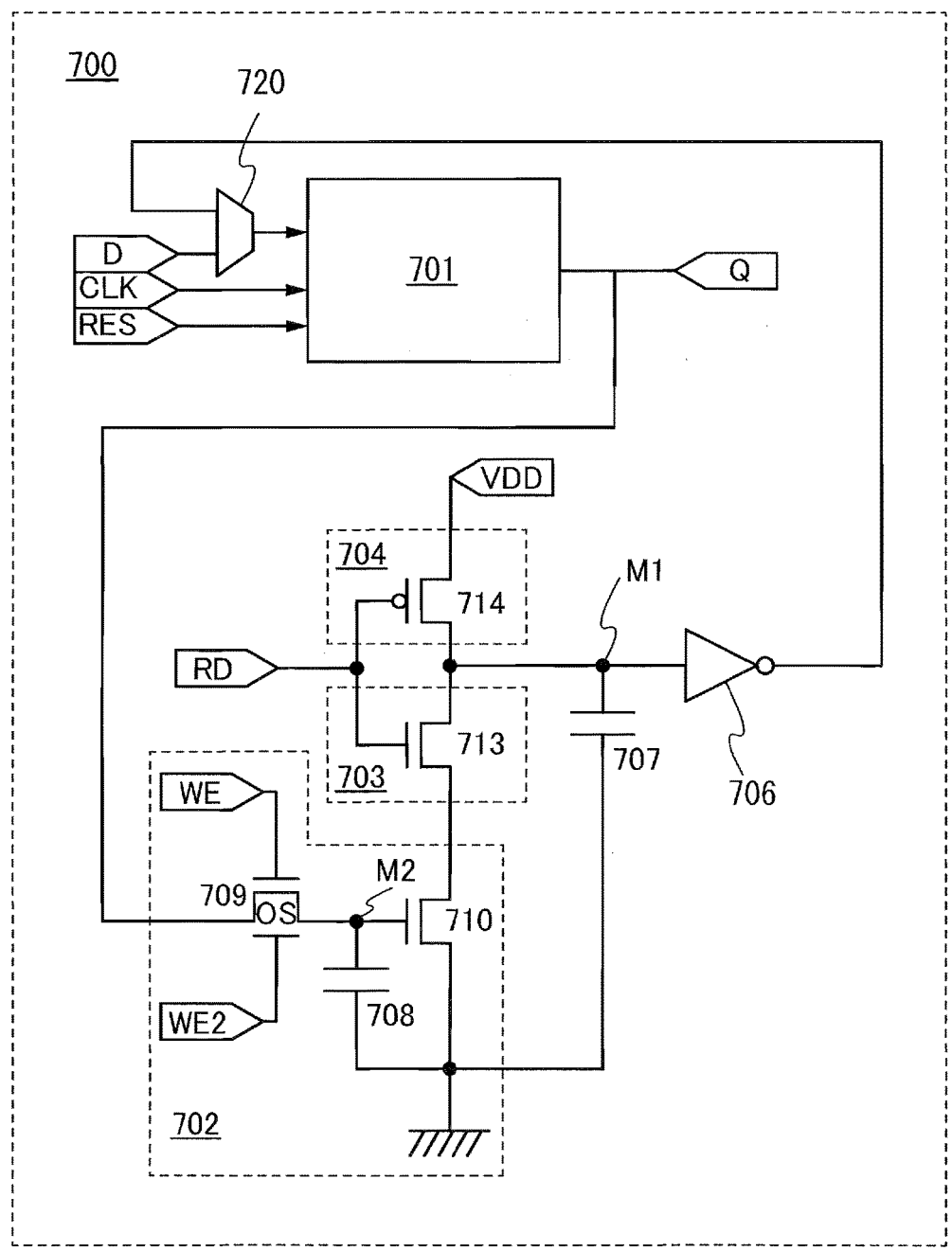
FIG. 10 is a circuit diagram illustrating a memory device according to one embodiment of the present invention.

FIG. 10 is an example of a circuit diagram of a storage element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the memory device described in the above embodiment can be used as the circuit 702. When supply of the power supply voltage to the memory element 700 is stopped, a ground potential (0 V) or a potential to turn off the transistor 709 in the circuit 702 continues to be input to a gate of the transistor 709. For example, the gate of the transistor 709 is grounded through a load such as a resistor.

An example in which the switch 703 is a transistor 713 having one conductivity type (e.g., an n-channel transistor) and the switch 704 is a transistor 714 having a conductivity type opposite to the one conductivity type (e.g., a p-channel transistor) is described. Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD is supplied. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring (line), or the like is actively utilized.

A control signal WE is input to the first gate (first gate electrode) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the circuit 701 is input to the other of the source and the drain of the transistor 709. FIG. 10 illustrates an example in which a signal output from the volatile memory circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 10, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is held is provided in the circuit 701, the signal output from the second terminal of the switch 703 (the other of the source and the drain of the transistor 713) can be input to the node.

As the transistor 709 in FIG. 10, the transistor described in Embodiment 1 can be used. As described in Embodiment 3, the transistor 709 preferably includes a second gate (second gate electrode). The control signal WE can be input to the first gate and the control signal WE2 can be input to the second gate. The control signal WE2 may be a signal having a constant potential. As the constant potential, for example, a ground potential GND or a potential lower than a source potential of the transistor 709 is selected. The control signal WE2 is a potential signal for controlling the threshold voltage of the transistor 709, and Icut of the transistor 709 can be further reduced. Note that as the transistor 709, the transistor without the second gate can be used.

In addition, in FIG. 10, the transistors included in the memory element 700 except for the transistor 709 can each be a transistor in which a channel is formed in a layer formed using a semiconductor other than an oxide semiconductor or in the substrate 1190. For example, the transistor can be a transistor in which a channel is formed in a silicon layer or a silicon substrate. Alternatively, a transistor in which a channel is formed in an oxide semiconductor layer can be used for all the transistors used for the memory element 700. Further alternatively, in the memory element 700, a transistor in which a channel is formed in an oxide semiconductor layer can be included besides the transistor 709, and a transistor in which a channel is formed in a layer or the substrate 1190 including a semiconductor other than an oxide semiconductor can be used for the rest of the transistors.

As the circuit 701 in FIG. 10, for example, a flip-flop circuit can be used. As the logic element 706, for example, an inverter, a clocked inverter, or the like can be used.

In the driving method of the semiconductor device of one embodiment of the present invention, in a period during which the memory element 700 is not supplied with the power supply voltage, data stored in the circuit 701 can be held by the capacitor 708 which is provided in the circuit 702.

The off-state current of a transistor in which a channel is formed in an oxide semiconductor layer is extremely low. For example, the off-state current of a transistor whose channel is formed in an oxide semiconductor layer is much lower than that of a transistor whose channel is formed in crystalline silicon. Thus, when such a transistor including an oxide semiconductor is used for the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

Since the switch 703 and the switch 704 are provided, the memory element performs a precharge operation; thus, the time required for the circuit 701 to hold original data again after the supply of the power supply voltage is restarted can be shortened.

In the circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the circuit 702. Consequently, an original signal can be accurately read even when a potential corresponding to the signal held by the capacitor 708 fluctuates to some degree.

By applying the memory element 700 to a memory device such as a register or a cache memory included in a processor, data in the memory device can be prevented from being lost owing to the stop of the supply of the power supply voltage. Furthermore, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although an example in which the memory element 700 is used in a CPU is described in this embodiment, the storage element 700 can also be used in a digital signal processor (DSP), a custom LSI, an LSI such as a programmable logic device (PLD), and a radio frequency identification (RF-ID).

Note that this embodiment can be combined with any of the other embodiments and examples described in this specification as appropriate.

Embodiment 6

In this embodiment, examples of an electronic appliance which can include the transistor described in Embodiment 1, the memory device described in Embodiment 3 or 4, or the CPU and the like (including a DSP, a custom LSI, a PLD, and an RF-ID) described in Embodiment 5 is described.

The transistor described in Embodiment 1, the memory device described in Embodiment 3 or 4, and the CPU and the like described in Embodiment 5 can be applied to a variety of electronic appliances (including game machines). Examples of the electronic appliances include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipments such as dialyzers and X-ray diagnostic equipments. In addition, the examples of the electronic appliances include alarm devices such as smoke detectors, heat detectors, gas alarm devices, and security alarm devices. Furthermore, the examples include industrial equipment such as guide lights, traffic lights, belt conveyors, elevators, escalators, industrial robots, and power storage systems. In addition, moving objects and the like driven by fuel engines and electric motors using power from non-aqueous secondary batteries are also included in the category of electronic appliances. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Some specific examples of these electronic appliances are illustrated in FIGS. 11A to 11C.

Figure 11A:
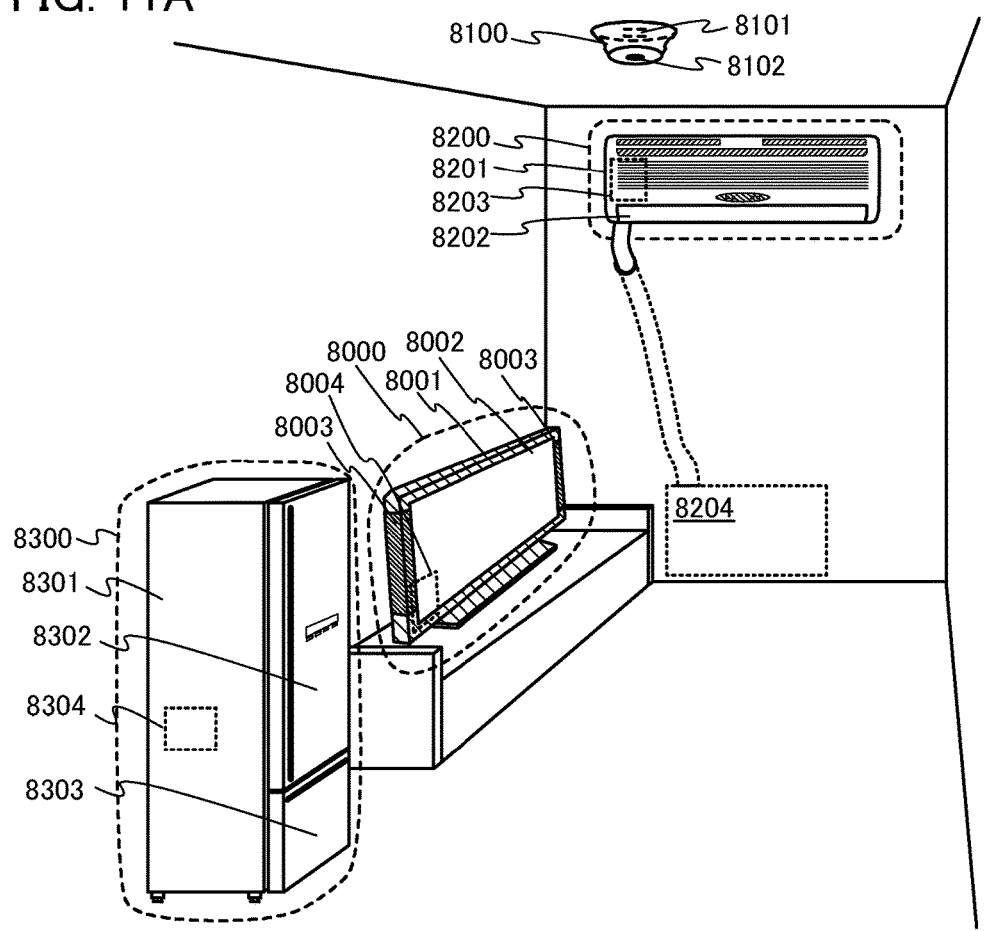
FIGS. 11A to 11C each illustrate an electronic appliance according to one embodiment of the present invention.
Figure 11B:
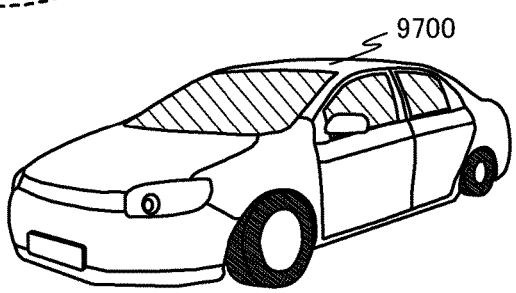
Figure 11C:
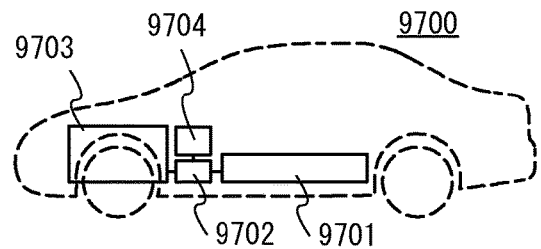

An alarm device 8100 illustrated in FIG. 11A is a residential fire alarm, and includes a sensor portion 8102 for smoke or heat and a microcomputer 8101. The microcomputer 8101 is an example of an electronic appliance including the transistor, the memory device, or the CPU described in any of the above embodiments.

An air conditioner which includes an indoor unit 8200 and an outdoor unit 8204 illustrated in FIG. 11A is an example of an electronic appliance including the transistor, the memory device, the CPU, or the like described in any of the above embodiments. Specifically, the indoor unit 8200 includes a housing 8201, an air outlet 8202, a CPU 8203, and the like. Although the CPU 8203 is provided in the indoor unit 8200 in FIG. 11A, the CPU 8203 may be provided in the outdoor unit 8204. Alternatively, the CPU 8203 may be provided in both the indoor unit 8200 and the outdoor unit 8204. The transistor described in the above embodiment is used in the CPU in the air conditioner, whereby power consumption is reduced.

An electric refrigerator-freezer 8300 illustrated in FIG. 11A is an example of an electronic appliance including the transistor, the memory device, the CPU, or the like described in any of the above embodiments. Specifically, the electric refrigerator-freezer 8300 includes a housing 8301, a door for a refrigerator 8302, a door for a freezer 8303, a CPU 8304, and the like. In FIG. 11A, the CPU 8304 is provided in the housing 8301. Any of the transistors described in the above embodiments is used in the CPU 8304 of the electric refrigerator-freezer 8300, whereby power consumption is reduced.

FIG. 11B illustrates an example of an electric vehicle which is an example of an electronic appliance. An electric vehicle 9700 is equipped with a secondary battery 9701. The output of the electric power of the secondary battery 9701 is adjusted by a circuit 9702 and the electric power is supplied to a driving device 9703. The circuit 9702 is controlled by a processing unit 9704 including a ROM, a RAM, a CPU, or the like which is not illustrated. The transistor described in the above embodiment is used in the CPU in the electric vehicle 9700, whereby power consumption is reduced.

The driving device 9703 includes a DC motor or an AC motor either alone or in combination with an internal-combustion engine. The processing unit 9704 outputs a control signal to the circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

Note that this embodiment can be combined with any of the other embodiments and examples described in this specification as appropriate.

Example 1

In this example, a sample where a conductive film was formed over an oxide semiconductor film was formed, and changes in conductivity of the oxide semiconductor with or without heat treatment were examined. The results are described below.

[Sample]

An about 300-nm-thick silicon oxide film was formed over a glass substrate by a sputtering method. Then, an about 50-nm-thick In—Ga—Zn oxide (hereinafter referred to as IGZO) was formed as an oxide semiconductor film over the silicon oxide film by a sputtering method. Note that the IGZO film was formed by a DC sputtering method with a sputtering target of IGZO containing In, Ga, and Zn at an atomic ratio of 1:1:1 and a deposition gas containing Ar and $O_2$ at a flow rate ratio of 2:1. Next, as a conductive film, an approximately 50-nm-thick tungsten film was formed over the IGZO film by a sputtering method. The tungsten film was formed by a DC sputtering method with a metal tungsten sputtering target and an Ar gas used as a deposition gas.

Next, the glass substrate was sectioned into two pieces, one sectioned part of the substrate was subjected to heat treatment at 400° C. under nitrogen atmosphere for one hour, and the other part was not subjected to heat treatment.

Then, tungsten films were removed from the two substrates by etching. The etching of the tungsten films were performed by dry etching using chlorine, carbon fluoride, and oxygen as an etching gas.

In this manner, a sample 1 that was subjected to heat treatment after the formation of the conductive film (hereinafter, referred to as the heated sample 1) and a sample 2 that was not subjected to heat treatment (hereinafter, referred to as the non-heated sample 2) were fabricated.

[Measurement of Sheet Resistance]

Next, sheet resistances of IGZO films with respect to etching depth were measured in such a manner that the measurement of sheet resistances and etching of the IGZO films were alternately performed on the samples repeatedly. The IGZO films were etched using a mixed solution of hydrogen peroxide water and ammonia. The remaining thicknesses of the IGZO films after the etching were measured using spectroscopic ellipsometry before and after the etching to obtain the depths to which the IGZO films were etched.

[Measurement Result]

Figure 12A:
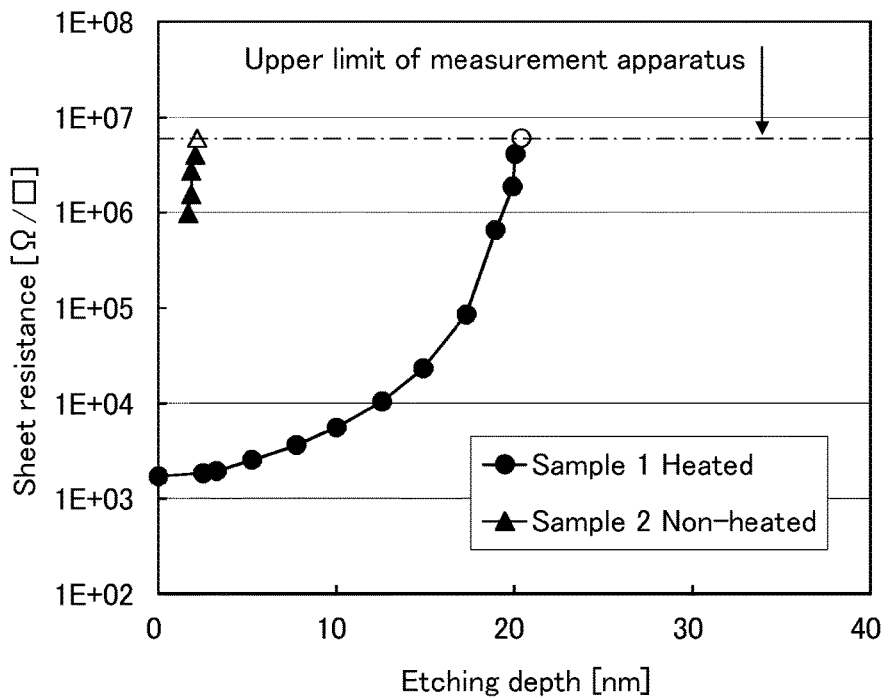
FIGS. 12A and 12B are graphs showing sheet resistance measured in Example.

FIG. 12A shows measurement results of sheet resistances with respect to etching depths of the heated sample 1 and the non-heated sample 2. Note that the upper limit of a measurement apparatus used for the measurement of the sheet resistance is $6 \times 10^6$ ohms per square, and the sheet resistance over the limit cannot be measured. Accordingly, the sheet resistance values over the upper limit are shown by an open circle and an open triangle in FIG. 12A.

Figure 12B:
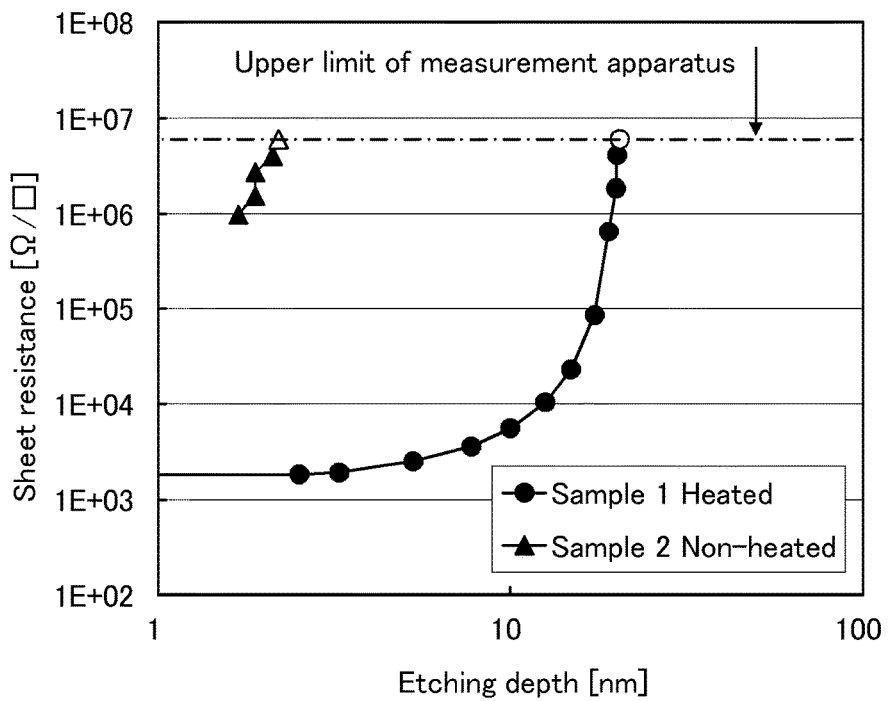

As shown in FIGS. 12A and 12B, the non-heated sample 2 shows extremely high resistance. On the other hand, it is confirmed that the heated sample 1 shows low resistance even in a region with a depth of about 20 nm from the surface of the IGZO film.

Only the vertical axis is a logarithmic axis in FIG. 12A, while the vertical and horizontal axes are logarithmic axes in FIG. 12B. In FIG. 12B, when a film shows a uniform conductivity in the thickness direction, the sheet resistance value is a linear function of the film thickness, and thus a set of points along a straight line is shown in the log-log graph. Because plots of the sample 2 shows a straight-line distribution in FIG. 12B, the uniform conductivity in the film thickness direction is shown in the case where the heat treatment is not performed. On the other hand, because the heated sample 1 does not show straight-line plots, it is suggested that the heated sample 1 has conductivity distribution where the conductivity changes continuously from the surface of the IGZO film in the depth direction.

Through the above, it is confirmed that the low-resistant region can be formed in the semiconductor film in the following manner: the conductive film is formed in contact with the semiconductor film including an oxide semiconductor, and heat treatment is performed thereon.

Moreover, it is also confirmed that the low-resistant region formed in the semiconductor film can have conductivity distribution where the conductivity is lowered as it is more distant from the contact surface with the conductive film.

Example 2

In this example, the conductivity of oxide semiconductor films having different compositions was examined by the method described in Example 1. The results are described below.

[Sample]

An about 50-nm-thick IGZO film was formed as a semiconductor film over a glass substrate by a sputtering method. Four targets, an IGZO containing In, Ga, and Zn at the atomic ratio of 1:1:1, an IGZO containing In, Ga, and Zn at the atomic ratio of 1:3:2, an IGZO containing In, Ga, and Zn at the atomic ratio of 1:6:4, and an IGZO containing In, Ga, and Zn at the atomic ratio of 1:9:6, were used to form IGZO films over different substrates. The formation of the IGZO films were performed by a DC sputtering using Ar and $O_2$ (the flow rate of Ar to $O_2$ is 2:1) as a deposition gas. Then, as conductive films, approximately 100-nm-thick tungsten films were formed over the IGZO films by a sputtering method. The tungsten films were formed by a DC sputtering method with a metal tungsten sputtering target and an Ar gas used as a deposition gas.

Then, the substrates with the IGZO films having different compositions were subjected to heat treatment at 400° C. under nitrogen atmosphere for one hour.

Then, the tungsten films were removed from the substrates by etching. The etching was performed under the conditions similar to those in Example 1.

In this manner, four samples were fabricated: a sample 3 was formed using the IGZO containing In, Ga, and Zn at the atomic ratio of 1:1:1 as a sputtering target; a sample 4 was formed using the IGZO containing In, Ga, and Zn at the atomic ratio of 1:3:2 as a sputtering target; a sample 5 was formed using the IGZO containing In, Ga, and Zn at the atomic ratio of 1:6:4 as a sputtering target; and a sample 6 was formed using the IGZO containing In, Ga, and Zn at the atomic ratio of 1:9:6 as a sputtering target.

[Measurement of Sheet Resistance]

Next, sheet resistances of the oxide semiconductor films in the samples with respect to etching depth were measured in a manner similar to that in Example 1.

[Measurement Result]

Figure 13A:
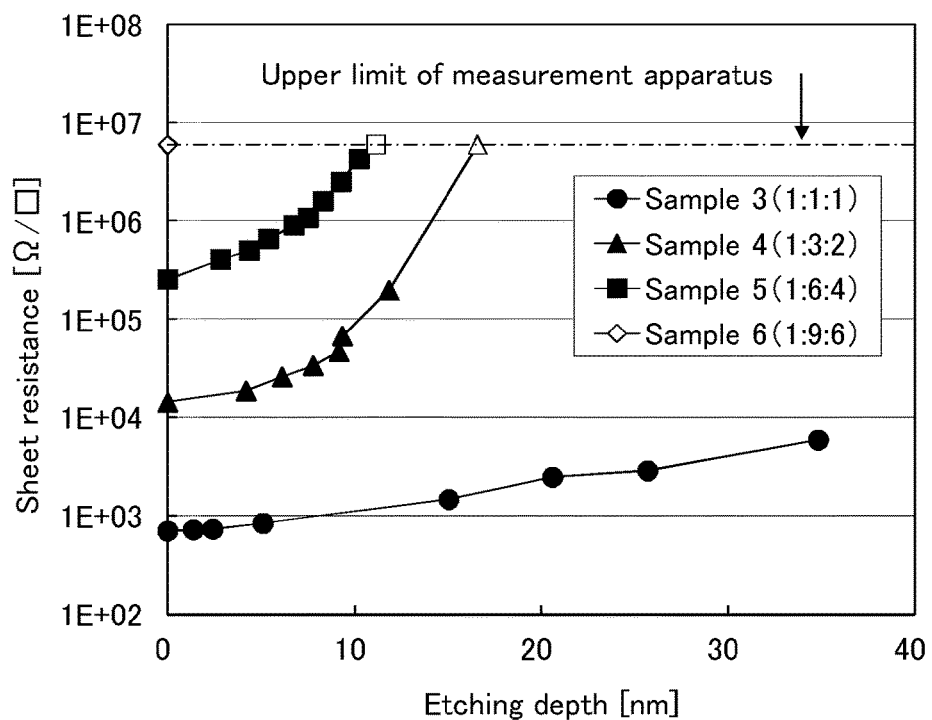
FIGS. 13A and 13B are graphs showing sheet resistance measured in Example.

FIG. 13A shows measurement results of sheet resistances with respect to etching depth in the samples.

As shown in FIG. 13A, it is known that the content of Ga lower than the content of In shows lower resistance. Moreover, the low-resistant region expands to a region distant (deep) from the surface. Although not shown in the figure, because the samples 3 to 5 do not show straight-line plots in the log-log graph, the conductivity distribution in the depth direction where higher resistance is shown in a region more distant from the surface can be confirmed.

Figure 13B:
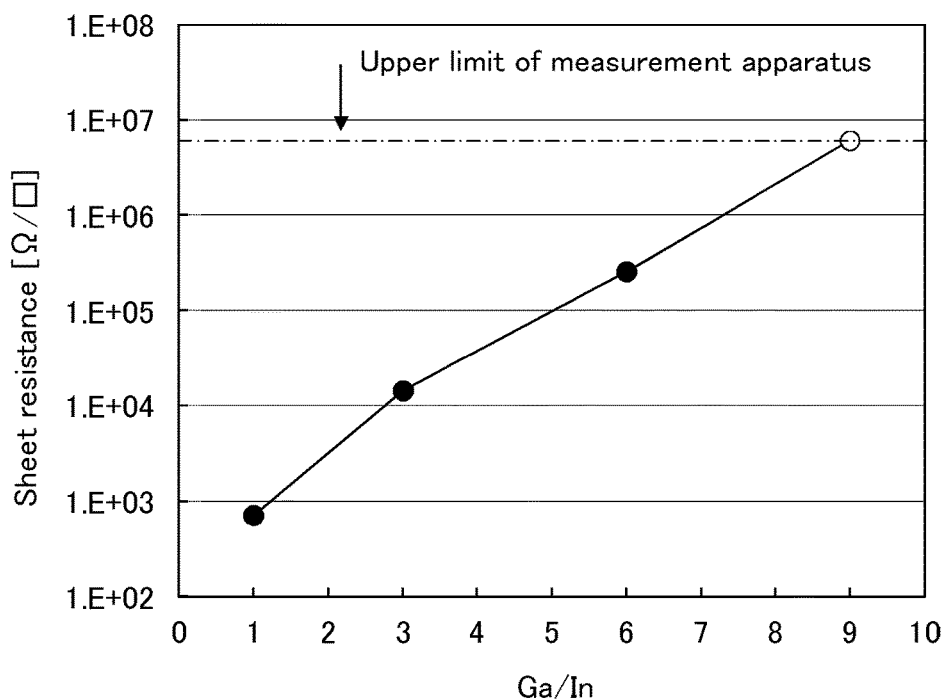

FIG. 13B is a graph showing plotted values of sheet resistances at 0 nm of etching depth in the IGZO films in FIG. 13A with the atomic ratio (content) of Ga to In in the IGZO films. As is apparent from FIG. 13B, as the content of Ga is increased with respect to the content of In, the sheet resistance values are increased exponentially. Specifically, when the content of Ga to In is increased three times with the sample 3 (Ga/In=1) regarded as the basis, the sheet resistance is increased ten or more times.

Through the above, it is confirmed that the material having the content of Ga to In higher than (preferably three or more times as high as) that of the semiconductor layer can be used for the oxide layer described in Embodiment 1 or the like. In particular, when an oxide layer having the content of Ga to In three or more times as high as that of the semiconductor layer is used as the oxide layer, the sheet resistance of the oxide layer can be increased by one digit higher than the sheet resistance of the semiconductor layer, and thereby can be sufficiently high resistance.

This application is based on Japanese Patent Application serial no. 2013-091211 filed with Japan Patent Office on Apr. 24, 2013, the entire contents of which are hereby incorporated by reference.

What is claimed is:

1. A semiconductor device comprising:
   a semiconductor layer over an insulating surface;
   a source electrode in direct contact with a first side surface of the semiconductor layer and overlapping with a first part of a top surface of the semiconductor layer;
   a drain electrode in direct contact with a second side surface of the semiconductor layer and overlapping with a second part of the top surface of the semiconductor layer;
   a first oxide layer between the source electrode and the semiconductor layer and overlapping with the first part of the top surface of the semiconductor layer;
   a second oxide layer between the semiconductor layer and the drain electrode and overlapping with the second part of the top surface of the semiconductor layer;
   a gate electrode overlapping with the semiconductor layer; and
   a gate insulating layer between the semiconductor layer and the gate electrode,
   wherein the first oxide layer and the second oxide layer are separated from each other,
   wherein the semiconductor layer comprises an oxide semiconductor, and
   wherein the first oxide layer and the second oxide layer each has a higher sheet resistance than a region of the semiconductor layer which overlaps with the first oxide layer or the second oxide layer.

2. The semiconductor device according to claim 1, wherein the source electrode and the drain electrode are not in contact with the top surface of the semiconductor layer.

3. The semiconductor device according to claim 1, wherein the source electrode and the drain electrode each comprises at least one selected from the group consisting of Al, Cr, Cu, Ta, Ti, Mo, and W.

4. The semiconductor device according to claim 1, wherein the semiconductor layer comprises In.

5. The semiconductor device according to claim 1, wherein the semiconductor layer comprises In and Ga.

6. The semiconductor device according to claim 1, wherein the semiconductor layer comprises In, M and Zn, where M is an element selected from the group consisting of Al, Ti, Ga, Y, Zr, La, Ce, Nd, and Hf.

7. The semiconductor device according to claim 6, wherein the first oxide layer and the second oxide layer each include In, M and Zn, and
   wherein a first proportion of M to In included in the first oxide layer and a second proportion of M to In included in the second oxide layer are higher than a proportion of M to In included in the semiconductor layer.

8. The semiconductor device according to claim 7, wherein in the first oxide layer and the second oxide layer, a number of atoms of M is three or more times as large as a number of atoms of In.

9. The semiconductor device according to claim 1, wherein the first oxide layer and the second oxide layer each include at least one selected from the group consisting of gallium oxide, Ga—Zn oxide, silicon oxide, silicon oxynitride, silicon nitride oxide, silicon nitride, aluminum oxide, and hafnium oxide.

10. The semiconductor device according to claim 1, wherein the semiconductor layer includes a crystal part.

11. The semiconductor device according to claim 1, wherein the gate electrode is provided over the semiconductor layer.

12. The semiconductor device according to claim 1, wherein the semiconductor layer is provided over the gate electrode.

13. The semiconductor device according to claim 1, further comprising a second gate electrode, wherein the semiconductor layer and the gate insulating layer are sandwiched between the gate electrode and the second gate electrode.

14. A semiconductor device comprising:
a semiconductor layer over an insulating surface;
a source electrode in direct contact with a first side surface of the semiconductor layer and overlapping with a first part of a top surface of the semiconductor layer;
a drain electrode in direct contact with a second side surface of the semiconductor layer and overlapping with a second part of the top surface of the semiconductor layer;
a first oxide layer located between the source electrode and the semiconductor layer and overlapping with the first part of the top surface of the semiconductor layer;
a second oxide layer located between the semiconductor layer and the drain electrode and overlapping with the second part of the top surface of the semiconductor layer;
a gate electrode over the semiconductor layer; and
a gate insulating layer between the semiconductor layer and the gate electrode,
wherein the first oxide layer and the second oxide layer are separated from each other in a first region,
wherein the semiconductor layer comprises an oxide semiconductor, and has a first portion in the first region,
wherein the first oxide layer and the second oxide layer each has a higher sheet resistance than a second region of the semiconductor layer which overlaps with the first oxide layer or the second oxide layer, and
wherein a thickness of the first portion of the semiconductor layer is smaller than a thickness of a second portion of the semiconductor layer in the second region.

15. The semiconductor device according to claim 14, wherein the source electrode and the drain electrode are not in contact with the top surface of the semiconductor layer.

16. The semiconductor device according to claim 14, wherein the source electrode and the drain electrode each comprises at least one selected from the group consisting of Al, Cr, Cu, Ta, Ti, Mo, and W.

17. The semiconductor device according to claim 14, wherein the semiconductor layer comprises In.

18. The semiconductor device according to claim 14, wherein the semiconductor layer comprises In, M and Zn, where M is an element selected from the group consisting of Al, Ti, Ga, Y, Zr, La, Ce, Nd, and Hf.

19. The semiconductor device according to claim 18,
wherein the first oxide layer and the second oxide layer each include In, M and Zn, and
wherein a first proportion of M to In included in the first oxide layer and a second proportion of M to In included in the second oxide layer are higher than a proportion of M to In included in the semiconductor layer.

20. The semiconductor device according to claim 19, wherein in the first oxide layer and the second oxide layer, a number of atoms of M is three or more times as large as a number of atoms of In.

21. The semiconductor device according to claim 18, wherein the first oxide layer and the second oxide layer each include at least one selected from the group consisting of gallium oxide, Ga—Zn oxide, silicon oxide, silicon oxynitride, silicon nitride oxide, silicon nitride, aluminum oxide, and hafnium oxide.

22. The semiconductor device according to claim 14, wherein the semiconductor layer includes a crystal part.

23. The semiconductor device according to claim 1, wherein the semiconductor layer comprises oxygen vacancies in a vicinity of an interface between the semiconductor layer and one of the source electrode and the drain electrode.

* * * * *